United States Patent [19]

Laube et al.

[11] Patent Number: 5,612,887
[45] Date of Patent: Mar. 18, 1997

[54] AUTOMATION OF PULSED LASER DEPOSITION

[75] Inventors: Samuel J. P. Laube, Cincinnati; Elizabeth F. Stark, Dayton, both of Ohio

[73] Assignee: The United States of America as represented by the Secretary of the Air Force, Washington, D.C.

[21] Appl. No.: 386,240

[22] Filed: Feb. 9, 1995

[51] Int. Cl.$^6$ ................................................ G06F 19/00
[52] U.S. Cl. .................... 364/468.26; 427/596; 505/474; 364/469.02
[58] Field of Search .................................. 364/477, 468, 364/550, 551.01, 496, 488, 489, 490, 491, 468.26, 469.02; 427/585, 586, 595, 596, 597, 62, 63; 118/696, 697, 708, 712, 713, 50.1; 505/325, 701, 473, 474, 480, 730, 732

[56] References Cited

U.S. PATENT DOCUMENTS

| | | | |
|---|---|---|---|
| 5,023,832 | 6/1991 | Fulcher, Jr. et al. | 364/900 |
| 5,067,107 | 11/1991 | Wade | 395/500 |

OTHER PUBLICATIONS

Laube, Samuel J.P.–"Hierarchical Control of Pulsed Laser Deposition of Processes For Manufacture"—Dissertation Submitted to Division of Research and Advanced Studies of Univ. of Cincinnati–Feb. 15, 1994–pp. 1–205.

S. J. P. Laube and E. F. Stark, "Feedback Control of Pulsed Laser Deposition Processes", *AIP Conf. Proceedings 288, Laser Ablation: Mechanisms and Applications–II*, Second International Conference, Knoxville, TN, Apr. 1993. pp. 242–247.

E. F. Stark and S. J. P. Laube, "Self Directed Control of Pulsed Laser Deposition", *ASM Journal of Materials Engineering and Performance*, vol. 2, No. 5, Oct., 1993, pp. 721–725 [cited as JMEPEG (1993)2:721–726], ASM International®, Matertials Park, OH 44073–0002.

S. J. P. Laube and E. F. Stark, "Artificial Intelligence in Process Control of Pulsed Laser Deposition", *AIRTC'94 Symposium on Artificial Intelligence in Real Time Control* (Preprints), Valencia, 3–5 Oct. 1994.

J. Cheung, J. Horowitz, "Pulsed Laser Deposition History and Laser–Target Interactions" *MRS Bulletin*, vol. 17, No. 2 (Feb. 1992), pp. 30–36.

R.K. Singh and J. Narayan, "Pulsed–Laser Evaporation Technique for Deposition of Thin Films: Physics and Theoretical Model", *Physical Review B, The American Physical Society*, vol. 41, No. 13, May 1990.

(List continued on next page.)

*Primary Examiner*—Joseph Ruggiero
*Attorney, Agent, or Firm*—Bernard E. Franz; Thomas L. Kundert; Gerald B. Hollins

[57] ABSTRACT

The Pulsed Laser Deposition (PLD) growth process uses a target of a given material and a substrate located within a vacuum chamber. A UV laser beam scans the target to produce a plasma which coats the substrate. Sensors for the vacuum chamber, with a data acquisition channel, are coupled to a process control computer. The bus is also coupled to a mirror gimbal control for directing the laser beam on the target. The process control provides for initializing a PLD instrumentation system, opening a data file, controlling deposit of a PLD film, determining when a desired deposition time or thickness is completed and then shutting down the laser, and closing the data file. Automation of PLD provides automatic instrumentation setup and real time automatic collection of the process variables, total vacuum quality, mass spectroscopy vacuum partial pressure, molybdenum I ionized species and bulk thickness deposition rate, as well as providing a methodology of ensuring uniform process health prior to making a deposition. Sensors are used to remotely monitor the status of the process, thus avoiding operator exposure to harmful UV rays produced by the pulsed high energy eximer laser. Automation of PLD also provides a uniform method of setting up the PLD process, to ensure similar process initial conditions prior to deposition.

2 Claims, 22 Drawing Sheets

OTHER PUBLICATIONS

P.S.P. Wei, R.B. Hall, and W.E. Maher, "Study of Laser–Supported detonation Waves by Time–Resolved Spectroscopy", *The Journal of Chemical Physics*, vol. 59, No. 7, 1 Oct. 1973, pp. 3692–3700.

D.B. Geohegan, "Physics and Diagnostics of Laser Ablation Plume Propagation for High–$T_c$ Superconductor Film Growth", Solid State Division, Oak Ridge National Laboratory, P.O. Box 2008, Oak Ridge, TN 37831–6056, submitted for the International Conference on Metallurgical Coatings and Thin Films, ICMCTF–92, San Diego, CA, Apr. 6–10, 1992.

D.B. Geohegan, "Effects of Ambient Background Gases on YBCO Plume Propagation Under Film Growth Conditions: Spectroscopic, Ion Probe, and Fast Photographic Studies", Solid State Division, Oak Ridge National Laboratory, P.O. Box 2008, Oak Ridge, TN 37831–6056, submitted for the E–MRS *Summer School on Laser Ablation of Electronic Materials: Basic Mechanisms and Applications*, Carcans–Maubuisson, France, Sep., 1991.

D.B. Chrisey and A. Inam, "Pulsed Laser Deposition of High $T_c$ Superconducting Thin Films for Electronic Device Applications", MRS Bulletin, Feb. 1992.

S.R. Foltyn, R.E. Muenchausen, R.C. Estler, E. Peterson, W.B. Hutchinson, K.C. Ott, N.S. Hubbard, R.C. Dye, X.D. Wu, "Influence of Beam and Target Properties on the Excimer Laser Deposition of $YBa_2Cu_3O_{7-x}$ Thin Films", Los Alamos National Laboratory, Los Alamos, NM 87545, *Materials Research Society Symp. Proc.* vol. 191, 1990, pp. 205–209.

N.H. Cheung, Q.Y. Ying, J.P. Zheng, and H.S. Kwok, "Time–Resolved Resonant Absorbtion Study of 532–nm Laser–Generated Plumes Over $YBa_2Cu_3O_7$ Targets", *J. App. Phys.* 69(9), 1 May 1991, American Institute of Physics, pp. 6349–6354.

T. Venkatesan, X.D. Wu, A. Inam, and J.B. Wachtman, "Observation of Two Distinct Components During Pulsed Laser Deposition of High $T_c$ Superconductor Films", *Appl. Phys. Lett* 52(14), 4 Apr. 1988, American Institute of Physics, pp. 1193–1195.

A. Gupta, B.Braren, K.G. Casey, B.W. Hussey, and R. Kelly, "Direct Imaging of the Fragments Produced During Excimer Laser Ablation of $YBa_2Cu_3O_{7-\delta}$", 1991.

G. Koren, A. Gupta, R. J. Baseman, M.I. Lutwyche, and R.B. Laibowitz, "Laser Wavelength Dependent Properties of $YBa_2Cu_3O_{7-\delta}$ Thin Films Deposited by Laser Ablation", *Appl. Phys. Lett* 55(23), 4 Dec. 1989, American Institute of Physics, pp. 2450–2452.

A. Inam, and X.D. Wu, "Pulsed Laser Etching of High $T_c$ Superconductor Films", *Appl. Phys. Lett* 51(14), 5 Oct. 1987, American Institute of Physics, pp. 1112–1114.

E.G. Scott, S.T. Davey, M.A.G.Halliwell, and G.J. Davies, "Improvements to and Characterization of GaInAs Heterointerfaces Grown by Molecular–Beam Epitaxy", J. VAc.Sci. technol. B 6, Mar./Apr. 1988, American Vacuum Society, pp. 603–605.

C.E. Otis, and R.W. Dreyfus, "Laser Ablation of $YBa_2Cu_3O_{7-\delta}$ as Probed by Laer–Induced Fluorescence Spectroscopy", *Physical Review Letters*, 7 Oct. 1991, The American Physical Society, pp. 2102–2105.

T. Spalvins, "Lubrication with Sputtered $MoS_2$ Films: Principles, Operation, and Limitations", *ASM Journal of Materials Engineering and Performance*, vol. 1, No. 3, Jun., 1992, pp. 347–351 [cited as JMEPEG (1992)1:347–352], ASM International®.

P.T. Murray, V.J. Dyhouse, L. Grazulis, and D.R. Thomas, "Dynamics of $MoS_2$ Photoablation", Mat. Res. Symp. Proc. vol. 201, 1991, Materials research Society, pp. 513–518.

AUTOMATION OF PULSED LASER DEPOSITION

RIGHTS OF THE GOVERNMENT

The invention described herein may be manufactured and used by or for the Government of the United States for all governmental purposes without the payment of any royalty.

RELATED APPLICATION

This application is related to an application by the same applicants titled "Hierarchical Feedback Control of Pulsed Laser Deposition", Ser. No. 08/386,368, now U.S. Pat. No. 5,535,128, filed on the same day, and hereby incorporated by reference.

BACKGROUND OF THE INVENTION

The present invention relates generally to automation of pulsed laser deposition.

In PLD operation, the deposition is made by energizing a material to be deposited into a high energy state by high energy laser light, after ultraviolet light. The material is typically in an ultrahigh vacuum environment, and is in solid state. The laser beam is generated by an eximer laser and focused on a target of material that is to be deposited. The laser beam is pulsed, and focused on the surface of the target material, so that target material is liberated into a high energy state, and deposits onto the surface to be coated. This complex equipment requires that continuous monitoring be done of not only the high energy laser device, but also the vacuum environment where the material to be deposited is contained.

The laser beam is not fixed in position of the target, but is often moved across the surface of the target so that excessive target damage will not occur. The laser beam is moved by a motorized mirror. The mirror must be calibrated so that the focused laser beam impinges on the target surface only, and not the target holder. Setup of the PLD system requires that the laser beam be calibrated so that the raster pattern will utilize as much target surface as possible, yet not impinge on the target holder. Each time the laser beam is focused, a re-calibration of the target edges is necessary. This process often requires the operator to be in the room, to look at the laser beam as it impinges on the target surface, and make corrections to the position of the beam as it moves across the target. The risk of operator exposure to ultraviolet light is high when doing the calibration. Remote operation removes this risk.

The proper operation of a PLD system requires that the ultra-high vacuum be sound, that the laser beam is focused onto the target correctly, and that the laser be functioning correctly. Maintaining these parameters during a PLD deposition requires the operator to monitor many system gages and indicators. Typically, these indicators are centrally located with the laser and ultrahigh vacuum apparatus. The operator must simultaneously record several values, while conducting a deposition.

The following publication items are of interest with respect to the present invention.

S. J. P. Laube and E. F. Stark, "Feedback Control of Pulsed Laser Deposition Processes", *AIP Conf. Proceedings 288, Laser Ablation: Mechanisms and Applications-II*, Second International Conference, Knoxville, Tenn., April 1993. pp.242–247.

E. F. Stark and S. J. P. Laube, "Self Directed Control of Pulsed Laser Deposition", *ASM Journal of Materials Engineering and Performance*, Vol. 2, No. 5, October, 1993, pp. 721–725 [cited as JMEPEG (1993)2:721–726], ASM International®, Matertials Park, Ohio 44073-0002.

S. J. P. Laube and E. F. Stark, "Artificial Intelligence in Process Control of Pulsed Laser Deposition", *AIRTC'94 Symposium on Artificial Intelligence in Real Time Control* (Preprints), Valencia, 3–5 Oct. 1994.

The above three papers authored by applicants are closely related to the invention.

Other papers of interest include:

J. Cheung, J. Horowitz, "Pulsed Laser Deposition History and Laser-Target Interactions" *MRS Bulletin*, vol. 17, No. 2 (February 1992), pp 30–36.

R. K. Singh and J. Narayan, "Pulsed-Laser Evaporation Technique for Deposition of Thin Films: Physics and Theoretical Model", *Physical Review B, The American Physical Society*, Vol. 41, No. 13, May 1990.

P. S. P. Wei, R. B. Hall, and W. E. Maher, "Study of Laser-Supported detonation Waves by Time-Resolved Spectroscopy", *The Journal of Chemical Physics*, Vol. 59, No. 7, 1 Oct. 1973, pp. 3692–3700.

D. B. Geohegan, "Physics and Diagnostics of Laser Ablation Plume Propagation for High-$T_c$ Superconductor Film Growth", Solid State Division, Oak Ridge National Laboratory, P.O. Box 2008, Oak Ridge, Tenn. 37831-6056, submitted for the International Conference on Metallurgical Coatings and Thin Films, ICMCTF-92, San Diego, Calif., Apr. 6–10, 1992.

D. B. Geohegan, "Effects of Ambient Background Gases on YBCO Plume Propagation Under Film Growth Conditions: Spectroscopic, Ion Probe, and Fast Photographic Studies", Solid State Division, Oak Ridge National Laboratory, P.O. Box 2008, Oak Ridge, Tenn. 37831-6056, submitted for the E-MRS *Summer School on Laser Ablation of Electronic Materials: Basic Mechanisms and Applications*, Carcans-Maubuisson, France, September, 1991.

D. B. Chrisey and A. Inam, "Pulsed Laser Deposition of High $T_c$ Superconducting Thin Films for Electronic Device Applications", MRS Bulletin, February 1992.

S. R. Foltyn, R. E. Muenchausen, R. C. Estler, E. Peterson, W. B. Hutchinson, K. C. Ott, N. S. Hubbard, R. C. Dye, X. D. Wu, "Influence of Beam and Target Properties on the Excimer Laser Deposition of $YBa_2Cu_3O_{7-x}$ Thin Films", Los Alamos National Laboratory, Los Alamos, N.M. 87545, *Materials Research Society Symp. Proc.* Vol. 191, 1990, pp 205–209.

N. H. Cheung, Q. Y. Ying, J. P. Zheng, and H. S. Kwok, "Time-Resolved Resonant Absorption Study of 532-nm Laser-Generated Plumes Over $YBa_2Cu_3O_7$ Targets", J. Appl. Phys. 69(9), 1 May 1991, American Institute of Physics, pp. 6349–6354.

T. Venkatesan, X. D. Wu, A. Inam, and J. B. Wachtman, "Observation of Two Distinct Components During Pulsed Laser Deposition of High $T_c$ Superconductor Films", *Appl. Phys. Lett* 52 (14), 4 Apr. 1988, American Institute of Physics, pp 1193–1195.

A. Gupta, B. Braren, K. G. Casey, B. W. Hussey, and R. Kelly, "Direct Imaging of the Fragments Produced During Excimer Laser Ablation of $YBa_2Cu_3O_{7-\delta}$", 1991.

G. Koren, A. Gupta, R. J. Baseman, M. I. Lutwyche, and R. B. Laibowitz, "Laser Wavelength Dependent Properties of $YBa_2Cu_3O_{7-\delta}$ Thin Films Deposited by Laser Ablation", *Appl. Phys. Lett* 55 (23), 4 Dec. 1989, American Institute of Physics, pp 2450–2452.

A Inam, and X. D. Wu, "Pulsed Laser Etching of High $T_c$ Superconductor Films", *Appl. Phys. Lett* 51 (14), 5 Oct. 1987, American Institute of Physics, pp 1112–1114.

E. G. Scott, S. T. Davey, M. A. G. Halliwell, and G. J. Davies, "Improvements to and Characterization of GaInAs Heterointerfaces Grown by Molecular-Beam Epitaxy", J. VAc. Sci. technol. B 6, Mar/Apr 1988, American Vacuum Society, pp. 603–605.

C. E. Otis, and R. W. Dreyfus, "Laser Ablation of $YBa_2Cu_3O_{7-\delta}$ as Probed by Laer-Induced Fluorescence Spectroscopy", *Physical Review Letters,* 7 Oct. 1991, The American Physical Society, pp. 2102–2105.

T. Spalvins, "Lubrication with Sputtered $MoS_2$ Films: Principles, Operation, and Limitations", *ASM Journal of Materials Engineering and Performance,* Vol. 1, No. 3, June, 1992, pp. 347–351 [cited as JMEPEG (1992)1:347–352], ASM International®.

P. T. Murray, V. J. Dyhouse, L. Grazulis, and D. R. Thomas, "Dynamics of $MoS_2$ Photoablation", Mat. Res. Symp. Proc. Vol. 201, 1991, Materials research Society, pp. 513–518.

SUMMARY OF THE INVENTION

An objective of the invention is to provide a pulsed laser deposition system with automated process setup and information collection to relieve the operator from menial tasks by computer automation, and also free the operator from monotonous tasks, such as data collection.

A PLD process is poorly modeled, and poorly understood as a dynamical deposition process. Observation of the PLD process by the combination instrumentation and computer setup allows for the simultaneous observation of many process parameters. This enables encompassing of many dimensions simultaneously, in order that many process parameters can be observed in real time as well as post analyzed. This technique enables the operator of the PLD process to observe many process aspects, which allows for a more combined total process overview, thus yielding a better understanding of how the PLD process behaves.

It is also important, for safety reasons, that the PLD process be operated by remote means. There is a high risk of operator exposure to ultraviolet high energy laser light, especially during alignment of the laser beam. The automation of laser setup and beam-target calibration eliminates the possible exposure of operator skin. There is also the possibility of operator ocular damage from glint reflections, notwithstanding some eye protective goggles. The remote setup and operation of the PLD eximer laser by computer control eliminates these exposure issues.

The invention relates to a multi-featured automation system which improves the manufacturing capability of the thin-film tribological growth process by Pulsed Laser Deposition (PLD). This system improves the repeatability and accuracy of the process, reduces the manpower requirements to operate PLD, and improves the PLD environment for scientific investigation. This system provides automatic calibration, setup, and data collection to ease the operation of PLD.

Automation of PLD provides automatic instrumentation setup and real time automatic collection of the process variables, total vacuum quality, mass spectroscopy vacuum partial pressure, molybdenum I ionized species and bulk thickness deposition rate, as well as providing a methodology of ensuring uniform process health prior to making a deposition. Sensors are used to remotely monitor the status of the process, thus avoiding operator exposure to harmful UV rays produced by the pulsed high energy eximer laser. Automation of PLD also provides a uniform method of setting up the PLD process, to ensure similar process initial conditions prior to deposition.

This invention is the first attempt at organizing the PLD process by the implementation of a sequential event expert system. The PLD process has not been used as a manufacturing process. This is partially due to the complexity of process operation and setup, as well as system health monitoring during deposition. Implementation of PLD as a manufacturing deposition process will be cost prohibitive without use of this invention.

DETAILED DESCRIPTION

The purpose of automated process setup and information collection is to relieve the operator from menial tasks by computer automation, and also free the operator form monotonous tasks, such as data collection. The PLD process is poorly modeled, and poorly understood as a dynamical deposition process. Observation of the PLD process by the combination instrumentation and computer setup allows for the simultaneous observation of many process parameters. This enables encompassing of many dimensions simultaneously, in order that the many process parameters can be observed in real time as well as post analyzed. This technique enables the operator of the PLD process to observe many process aspects, which allows for a more combined total process overview, thus yielding a better understanding of how the PLD process behaves.

It is also important, for safety reasons, that the PLD process be operated by remote means. There is a high risk of operator exposure to ultraviolet high energy laser light, especially during alignment of the laser beam. The automation of laser setup and beam-target calibration eliminates the possible exposure of operator skin. There is also the possibility of operator ocular damage from glint reflections, with some eye protective goggles. The remote setup and operation of the PLD eximer laser by computer control eliminates these exposure issues.

PLD is a complex deposition process, requiring precise control of many system parameters. Setup and operation of the deposition process often overburdens the operator so that little time is spent observing process behavior. Automation of process parameter recording by computer controlled instrumentation frees the operator so that process behavior can be observed.

Operation of PLD also requires the manual recording of several instruments during a deposition. It is not possible to observe several instruments simultaneously. It is also possible that trends or high speed phenomena occur during PLD deposition that are not able to be observed by the operator. The implementation of computer controlled instrumentation, process initialization recipes, and data collection provides a means of observing similar process behavior over many depositions, observations that otherwise would go unobserved in the case of manual observation techniques.

HARDWARE

Figure 1:
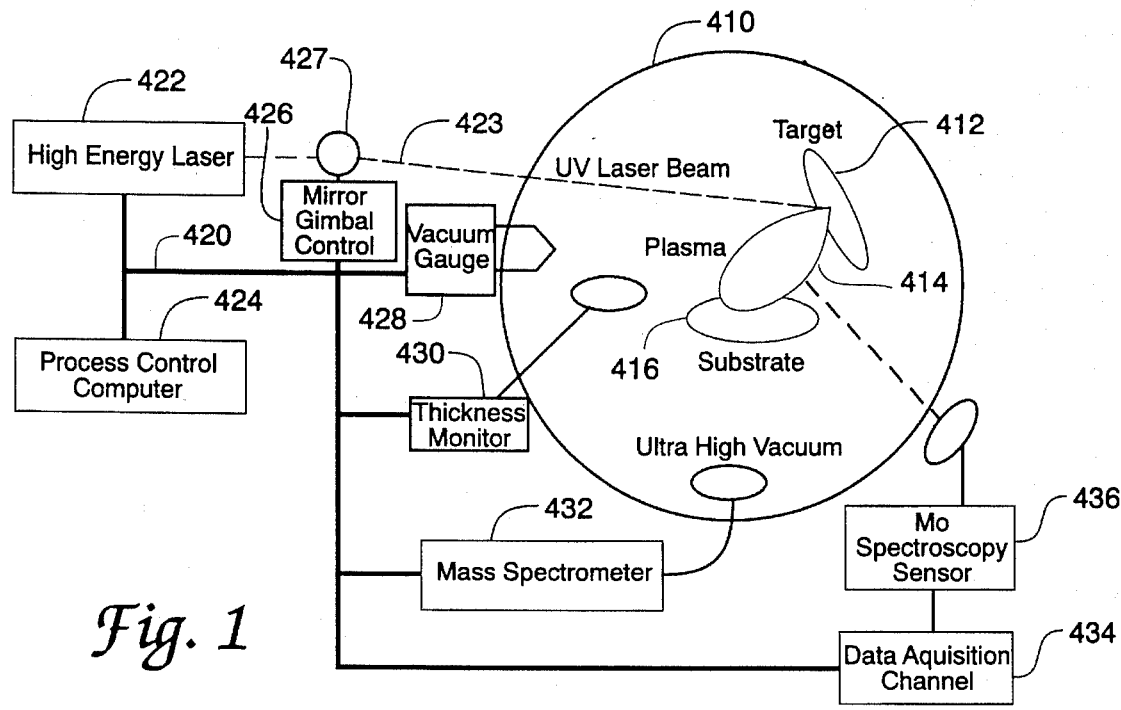
FIG. 1 is a diagram of a system automation instrumentation implementation.

In order to implement feedback control, a process instrumentation and control suite, such as that shown in FIG. 1 is needed, The control can be incorporated into the automation scheme as a module.

The hardware module of FIG. 1 includes an ultra high vacuum chamber 410 in which are located the target 412 producing a plasma 414 to the substrate 416. An IEEE 488 bus 420 interconnects a high energy laser 422, a process control computer 424, a mirror gimbal control 426, a vacuum gauge 428, a thickness monitor 430, a mass spectrometer 432 and a data acquisition channel 434. The vacuum gauge 428, the thickness monitor 430, the mass spectrometer 432 and a Mo spectroscopy sensor 436 all have sensors within the vacuum chamber 410. The Mo spectroscopy sensor 436 supplies data to the data acquisition channel 434.

Figure 1A:
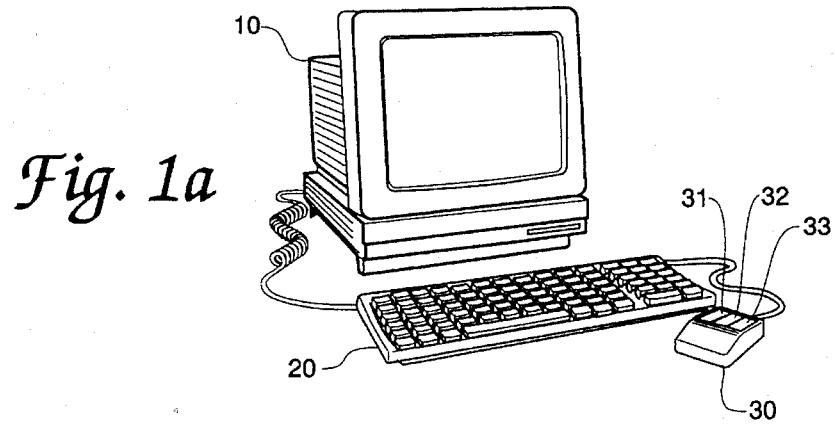
FIG. 1a is a pictorial view of a computer which may be used as a process control computer for the system of FIG. 1.

FIG. 1a is a pictorial view of a computer which may be used as a the process control computer 424 for the system of FIG. 1. It comprises a central processing unit and memory devices, a monitor 10, a keyboard 20, and a mouse 30. The mouse is shown as having three buttons 31, 32 and 33, but may generally have only two buttons.

Figure 2:
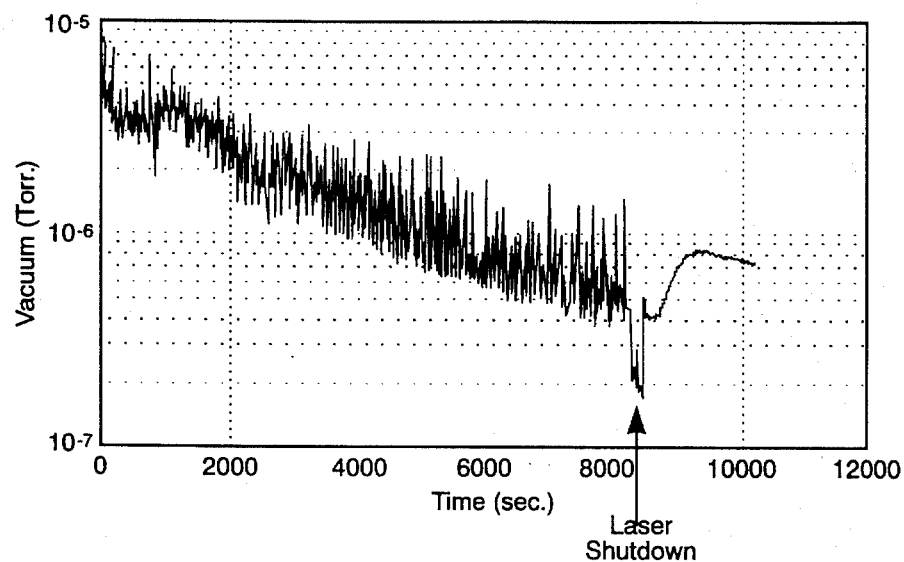
FIG. 2 is a graph showing a typical vacuum during a deposition.

FIG. 2 is a graph showing a typical vacuum during a deposition. This graph shows how vacuum increases over time during a deposition. This is an indication that the amount of material coming off the target is decreasing over time.

Figure 3:
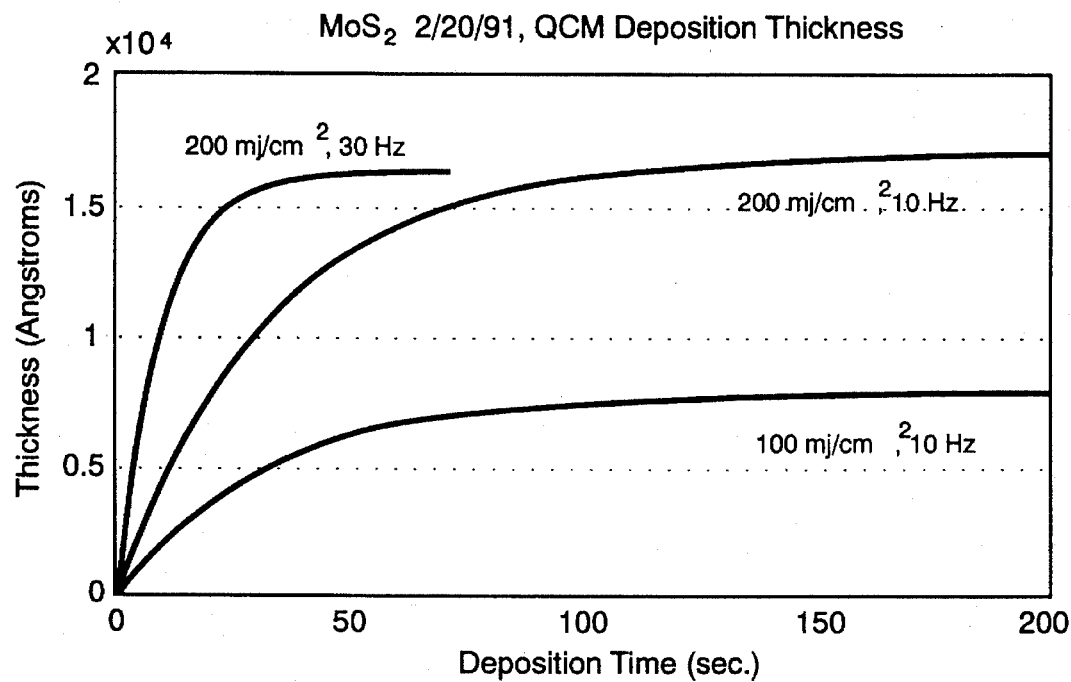
FIG. 3 is a graph showing a typical $MoS_2$ thickness with respect to time for different laser parameters, collected in real time during three separate depositions.

FIG. 3 is a graph showing a typical $MoS_2$ thickness with respect to time for different laser parameters, collected in real time during three separate depositions. The relationship between deposited thickness, laser energy density, and laser pulse rate is not linear. Changes in the laser parameters for a deposition cause drastic changes in deposition final thickness and deposition rates. Three deposition runs were performed for $MoS_2$ with three sets of laser operating parameters. The thickness during deposition was recorded with respect to time. Since the laser is capable of operating with pulse repetition rates up to 100 Hz and energy densities to 250 $mj/cm^2$, these graphs by no means indicate the entire deposited thickness behavior.

Figure 4:
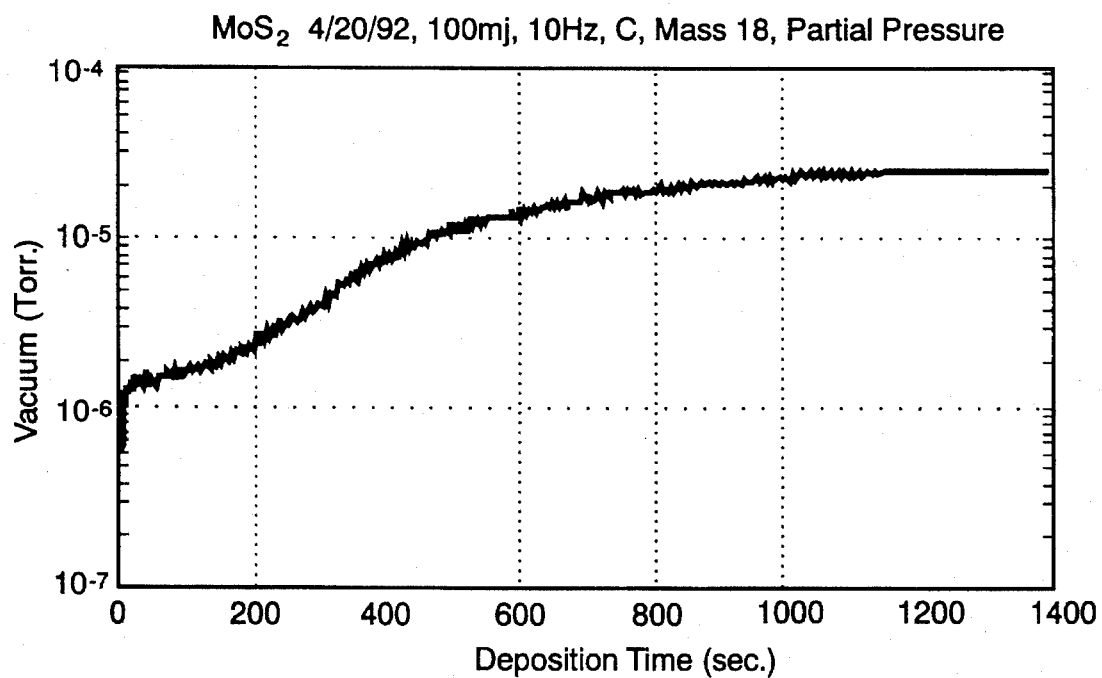
FIG. 4 is a graph showing a typical mass spectra for water during ablation of a non-baked target.

FIG. 4 is a graph showing a typical mass spectra for water during ablation of a non-baked target. This shows that water is becoming prevalent in the system, the only place for water to come from is within the target. This shows contamination of the target, leading to contamination of the film, due to water absorption. The way to avoid this contamination is to bake out the target prior to deposition.

Figure 5:
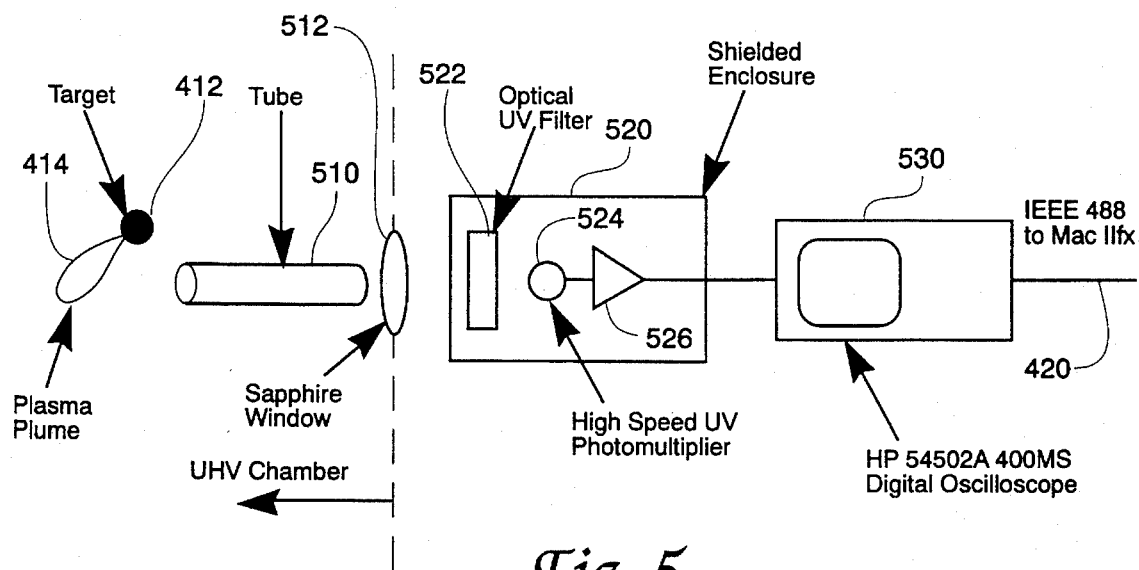
FIG. 5 is a diagram of a spectroscope design.

FIG. 5 is a diagram of a spectroscope design. This is the Mo spectroscopy sensor 436 shown in FIG. 4. The plasma plume 414 from the target 412 is viewed via a tube 510 and a sapphire window 512. A shielded enclosure 520 encloses an optical ultra violet filter and a high speed ultra violet photomultiplier 524. Output from the photomultiplier 524 is supplied via an amplifier 526 to a digital oscilloscope 530 (type HP 5402A 400 million samples/second). Digital data from the oscilloscope 530 is supplied via the IEEE 488 bus 420 to the process control computer 424 in FIG. 4.

Figure 6:
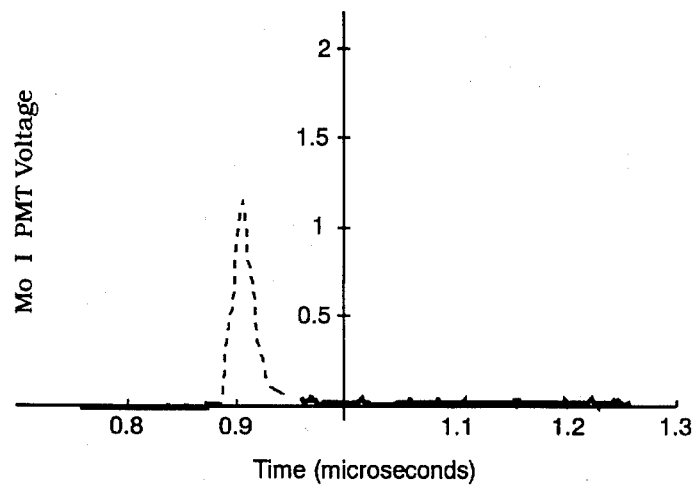
FIG. 6 is a graph showing a Mo I spectroscopy response with laser at 50 mj/cm$^2$ and 10 Hz PRF.

FIG. 6 is a graph showing a Mo I spectroscopy response with laser at 50 $mj/cm^2$ and 10 Hz PRF.

Figure 7:
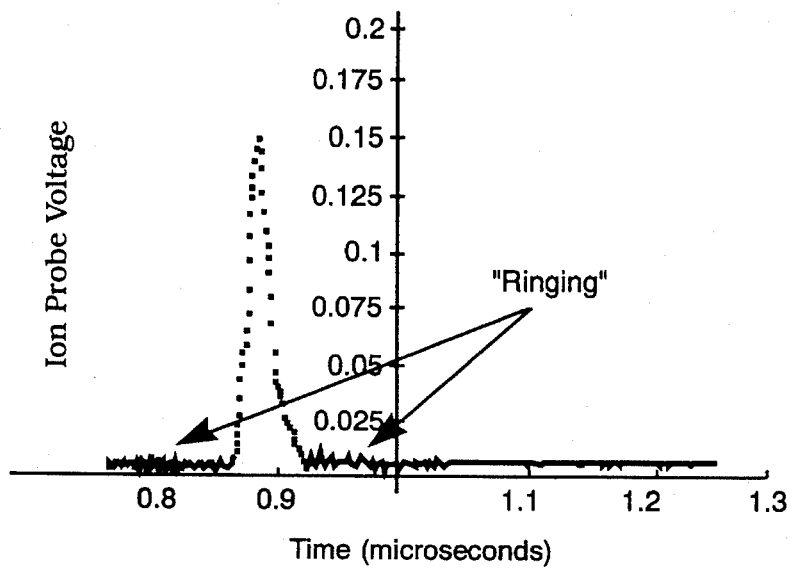
FIG. 7 is a graph showing ion probe response for the laser pulse shown in FIG. 6 (probe bias 240 VDC)

FIG. 7 is a graph showing ion probe response for the same laser pulse shown in FIG. 6 (probe bias 240 VDC). Waveforms on a per-shot basis from both ion probe and high speed spectroscope were digitized at a 400 million samples/second rate. Both waveforms show strong correlation indicating dominant Mo I ionized species in the PLD plume. A typical spectroscope waveform taken simultaneously (interleaved sampling) with ion probe waveforms show the strong correlation and appearance. Measurements of spectroscopic data in the form of PMT waveform rise time, fall time, and area under the curve for various laser parameters provides a mapping that describes Mo I plasma constituent speeds and relative density as a function of laser parameters.

Figure 8:
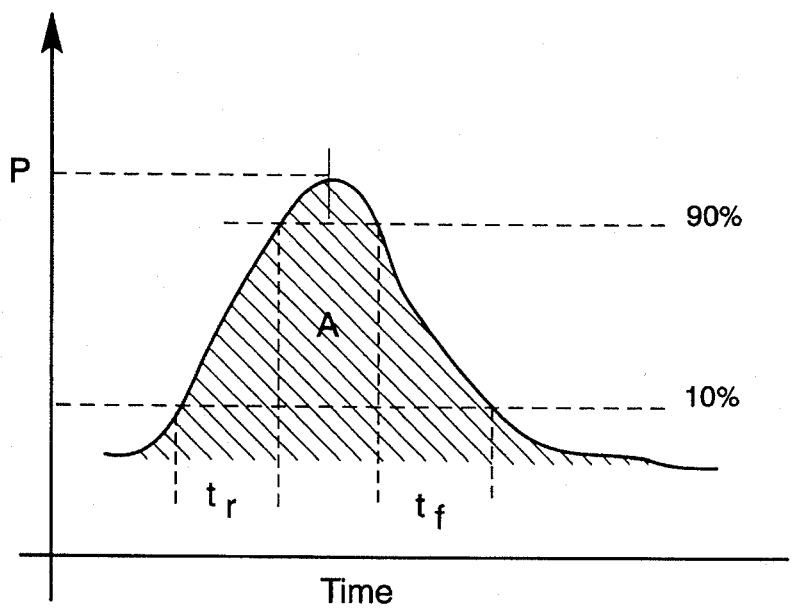
FIG. 8 is a graph showing Mo I relative species density measurement method.

FIG. 8 is a graph showing Mo I relative species density measurement method.

FLOW CHARTS

FIGS. 9–28 are flow charts of a pulsed laser deposition sequence. A pseudo code listing relating to the sequence appears before the claims in this document.

Figure 10:
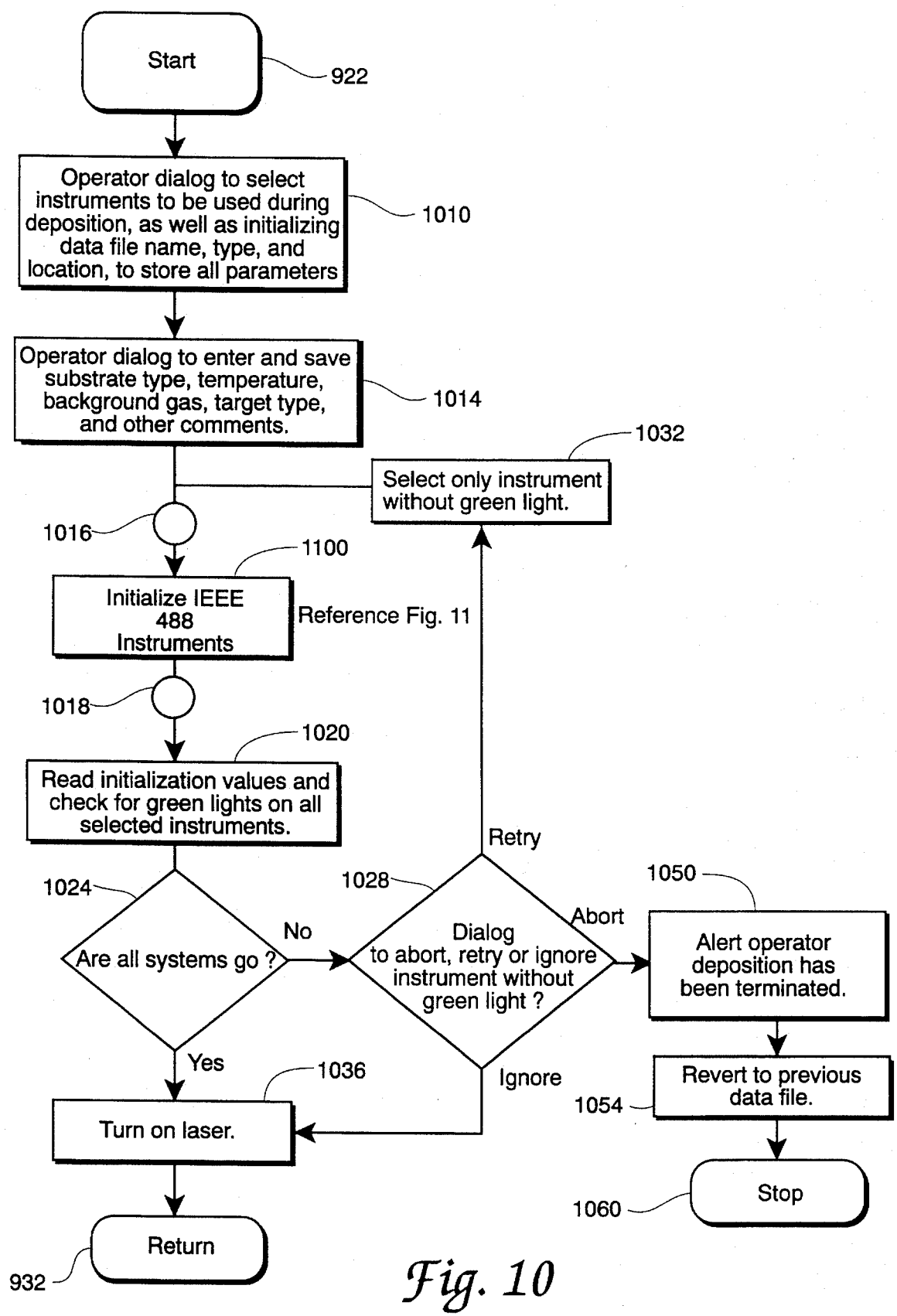
Figure 21:
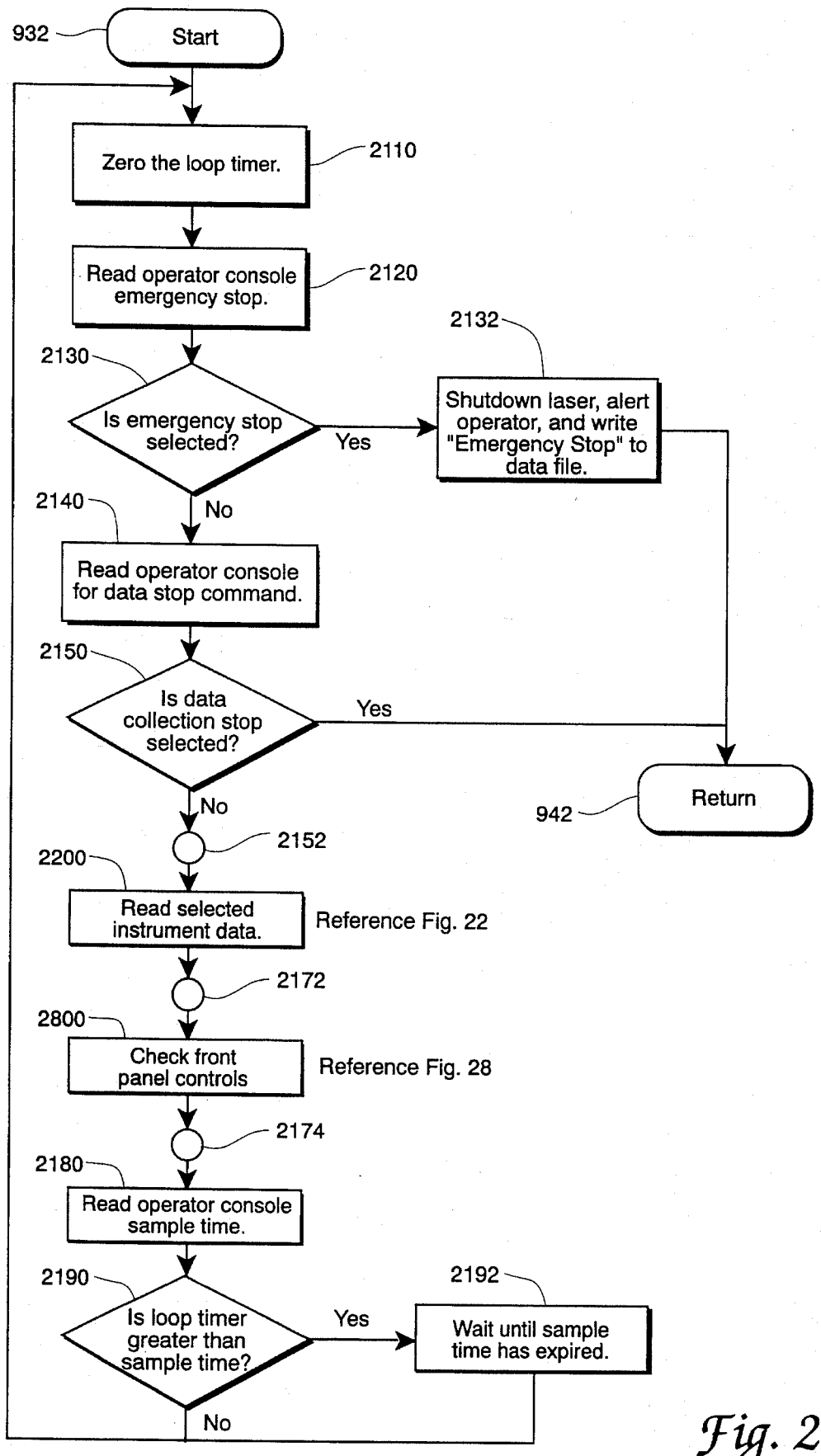

Operation of the system starts at block 910 and goes to block 920 to disable operating system interrupt driven events. The operation then goes via connector 922 to block 1000 to initialize the PLD instrumentation system, as shown in FIG. 10. After return from FIG. 10 via connector 932, the operation goes to block 2100 to deposit the PLD film, as shown in FIG. 21. After return via connector 942, to operation goes to block 950 to close the data file, and re-enable system interrupt driven events. The operation then stops at block 960.

The "initialize PLD instrumentation system" routine 1000 shown in FIG. 10 starts from connector 922, and goes to block 1010 for an operator dialog to select instruments to be used during deposition, as well as initializing data file name, type, and location, to store all parameters. Then at block 1014 there is an operator dialog to enter and save substrate type, temperature, background gas, target type, and other comments.

The operation then goes via connector 1016 to a routine 1100 (reference FIG. 11) to initialize the instruments connected to the IEEE 488 bus 420. The return via connector 1018 goes to block 1020 to read the initialization values and check for green lights on all selected instruments.

At a decision block 1024, the program asks "are all systems go". If the determination is "no", the flow goes to another decision block 1028 for a dialog to abort, retry or ignore the instrument without a green light. If "retry" is entered, the operation goes to block 1032, to give a command to select only the instrument without a green light, and return via the connector 1016 to block 1100. If "abort" is entered, the operation goes to block 1050 to alert the operator that deposition has been terminated, after which at block 1054 the program reverts to a previous data file, and stops at block 1060.

If "ignore" is entered at block 1028, or the decision from block 1024 is "yes" operation goes to block 1036 to turn on the laser 422. Return via connector 932 (FIG. 9) takes the operation to block 2100 and FIG. 21 to deposit the PLD film.

Figure 11:
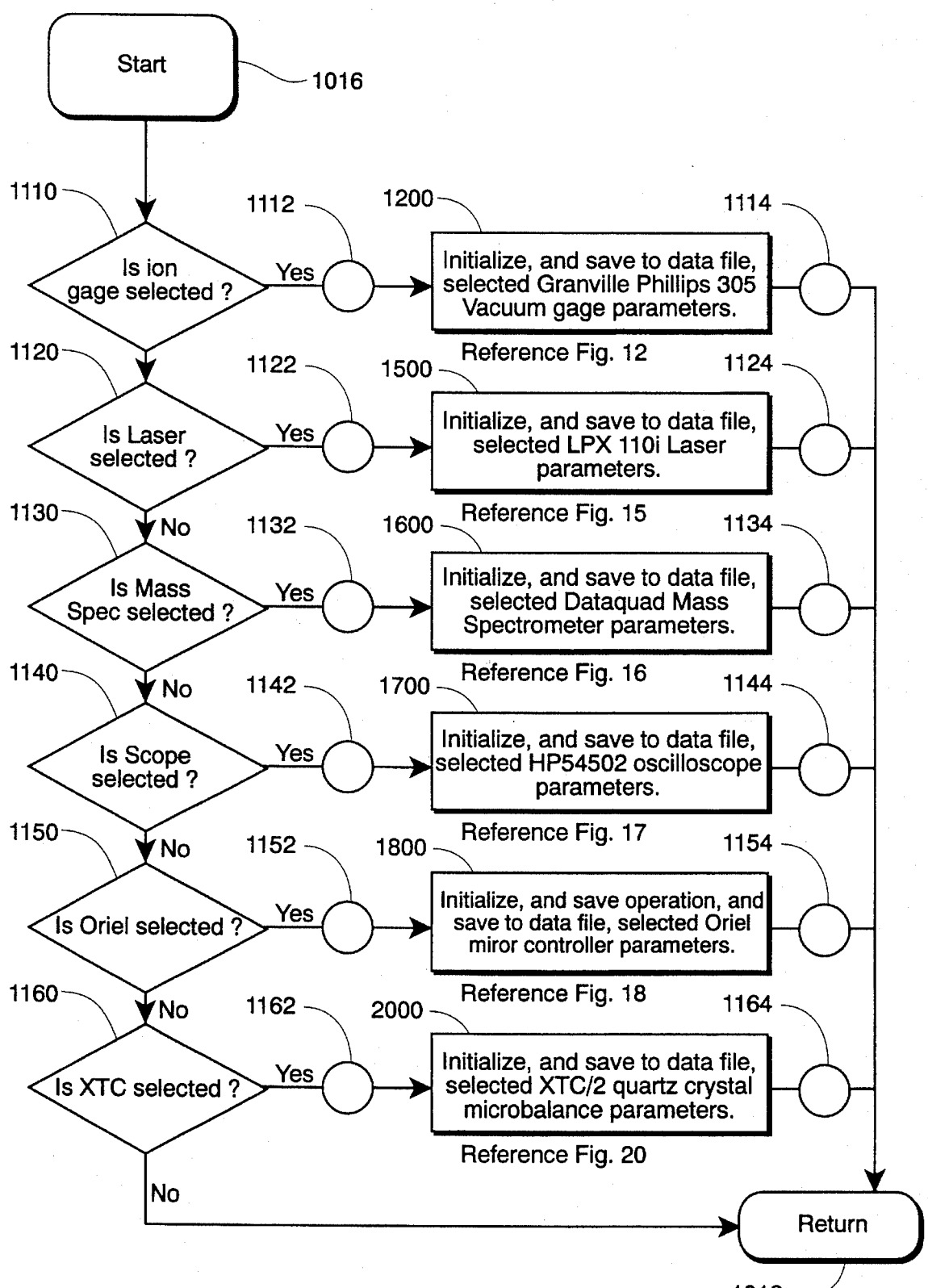

FIG. 11 represents a case statement, or series of "if-then" decisions, starting from the connector 1016. if the ion gage (vacuum gage 428 in FIG. 1) is selected, then from block 1110 via connector 1112, the operation goes to a routine 1200 (FIG. 12) to initialize, and save to data file, the selected Granville Phillips 305 Vacuum gage parameters. If the laser (422 in FIG. 1) is selected, then from block 1120 via connector 1122, the operation goes to a routine 1500 (FIG. 15) to initialize, and save to data file, the selected LPX 110i Laser parameters. If the mass spectrometer (432 in FIG. 1) is selected, then from block 1130 via connector 1132, the operation goes to a routine 1600 (FIG. 16) to initialize, and save to data file, the selected Dataqual Mass Spectrometer parameters. If the scope (530 in FIG. 5) is selected, then from block 1140 via connector 1142 the operation goes to a routine 1700 (FIG. 17) to initialize, and save to data file, the selected HP54202 oscilloscope parameters. If the Oriel is selected, then from block 1150 via connector 1152, the operation goes to a routine 1800 (FIG. 18) to initialize, and save to data file, the selected Oriel Mirror controller (426 in FIG. 1) parameters. If the XYC is selected, then from block 1160 via connector 1162, the operation goes to a routine 2000 (FIG. 20) to initialize, and save to data file, the selected XTC/2 quartz crystal microbalance (430 in FIG. 1) parameters. At the completion of the operation in any of the initialize parameter routines in FIG. 11, or if the decisions from blocks 1110 to 1160 are all no, operation returns via connector 1018 to FIG. 10.

Figure 12:
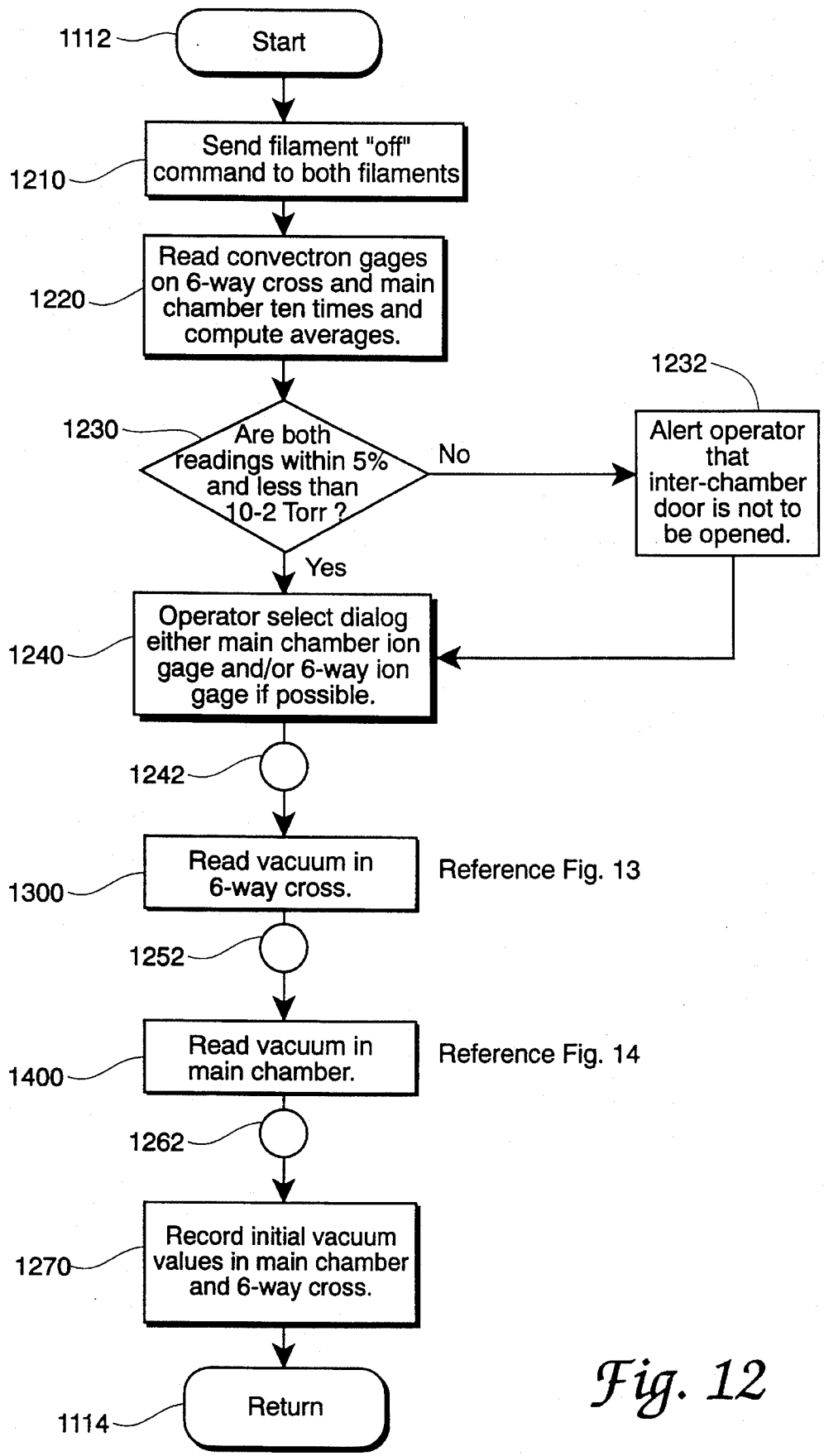

The operation of block 1200 in FIG. 11, to initialize the vacuum gage parameters, is shown In FIG. 12, starting from the connector 1112. At block 1210, the program sends a filament "off" command to both the main chamber and six way cross filaments. Then at block 1220, the operations is to read convection gages on a 6-way cross and on the main chamber ten times each and compute averages. The next block 1230 is for a decision if both readings are within 5% and less that $10^{-2}$ Torr. If no, the flow is to block 1232 to alert the operator that inter-chamber door in not to be opened. From block 1232, or from a "yes" decision at block 1230, operation goes to block 1240 for an operator dialog to select either a main chamber ion gage and/or a six way ion gage if possible. Then operation goes via connector 1242 to a routine 1300 (FIG. 13) to read the vacuum in the 6-way cross. From there via connector 1252 the flow goes to a routine 1400 (FIG. 14) to read the vacuum in the main chamber, and return via connector 1262. At the next block 1270, the program records the initial vacuum values in the main chamber and 6-way cross. The flow then returns via connector 1114 to FIG. 11.

Figure 13:
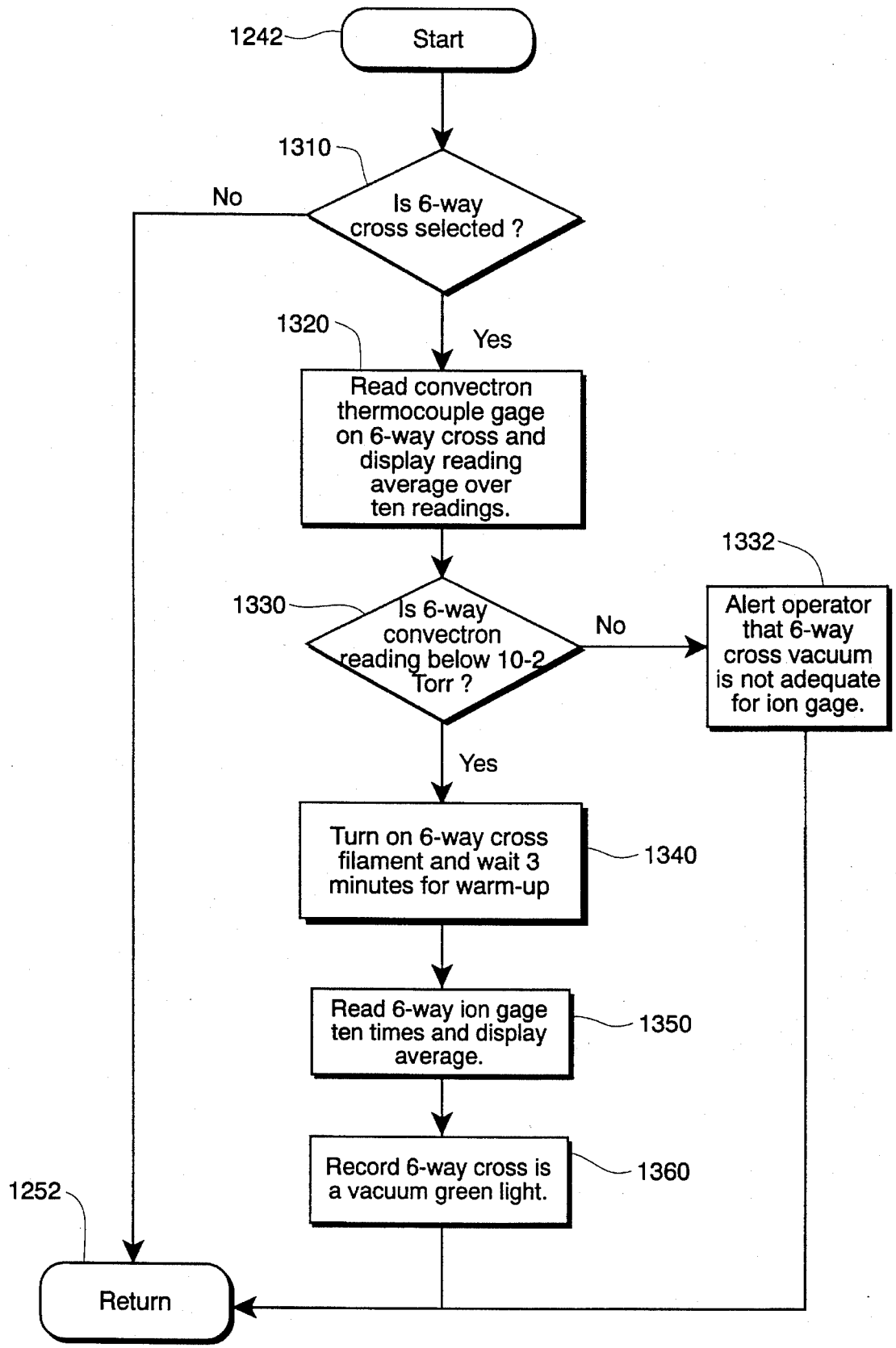

The routine 1300 to read the vacuum in the 6-way cross, is shown in FIG. 13, starting from the connector 1242. The first block 1310 is for a decision to determine whether the 6-way cross is selected. If "no" operation returns via connector 1252 If "yes", operation goes to block 1320 to read the convectron thermocouple gage on the 6-way cross and display the reading over an average of ten readings. The next block 1330 is for a decision to determine if the 6-way convectron reading is below $10^{-2}$ Torr. If "no", operation goes to block 1332 to alert the operator that the 6-way cross vacuum is not adequate for the ion gage, and return via connector 1252. If the decision at block 1330 is "yes" operation goes to block 1340 to turn on the 6-way cross filament and wait three minutes for warm-up, then to block 1350 to read the 6-way ion gage ten times and display the average, then to block 1360 to record that the 6-way cross is a vacuum green light. Operation then returns via connector 1252 to FIG. 12.

Figure 14:
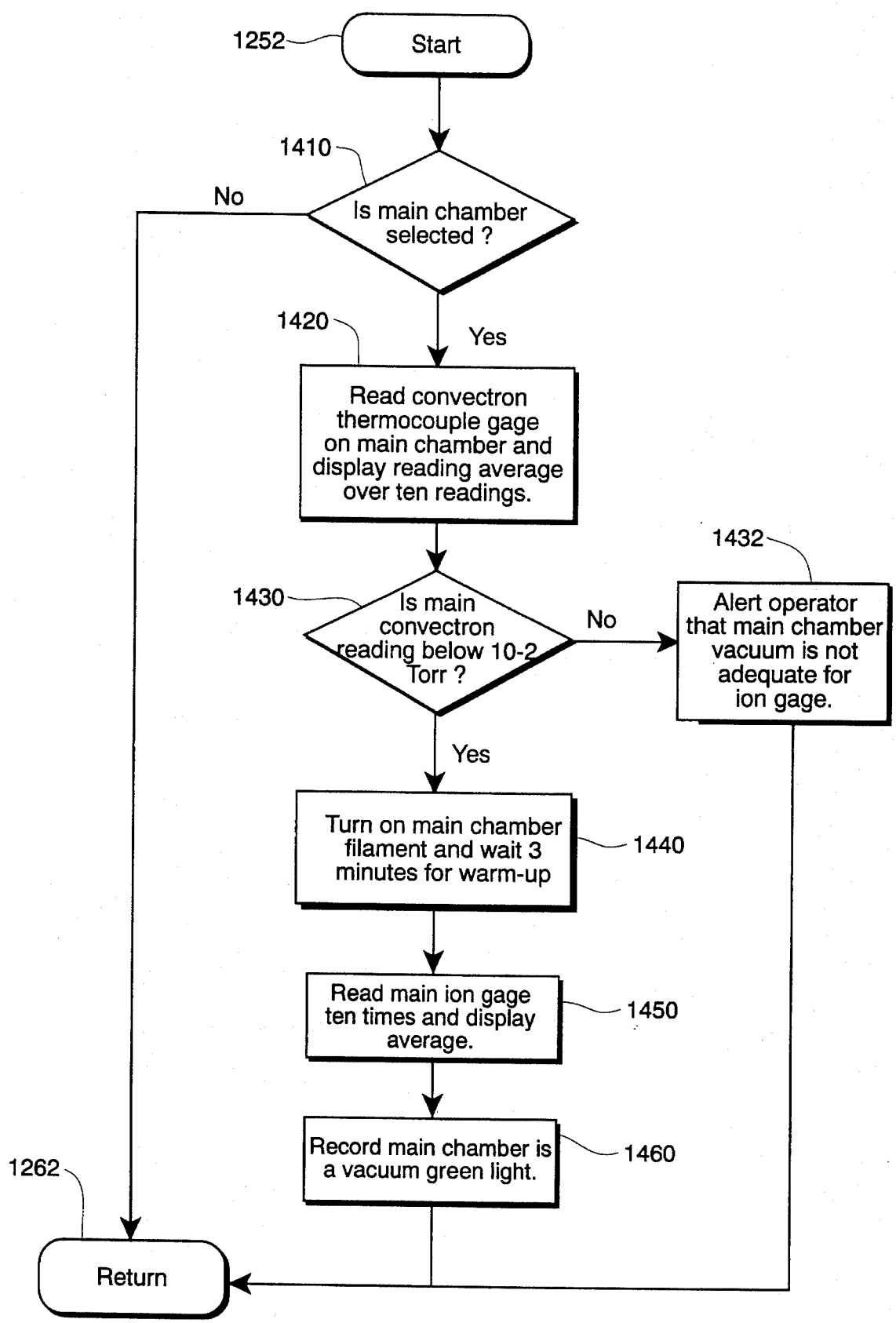

The routine 1400 to read the vacuum in the main chamber, is shown in FIG. 14, starting from the connector 1252. The first block 1410 is for a decision to determine whether the main chamber is selected. If "no", operation returns via connector 1262. If "yes". operation goes to block 1420 to read the convectron thermocouple gage on the main chamber and display the reading over an average of ten readings. The next block 1430 is for a decision to determine if the main convectron reading is below $10^{-2}$ Torr. If "no" operation goes to block 1432 to alert the operator that the main chamber vacuum is not adequate for the ion gage, and return via connector 1262. If the decision at block 1430 is "yes" operation goes to block 1440 to turn on the main chamber filament and wait three minutes for warm-up, then to block 1450 to read the main ion gage ten times and display the average, then to block 1460 to record that the main chamber is a vacuum green light. Operation then returns via connector 1262 to FIG. 12.

Figure 15:
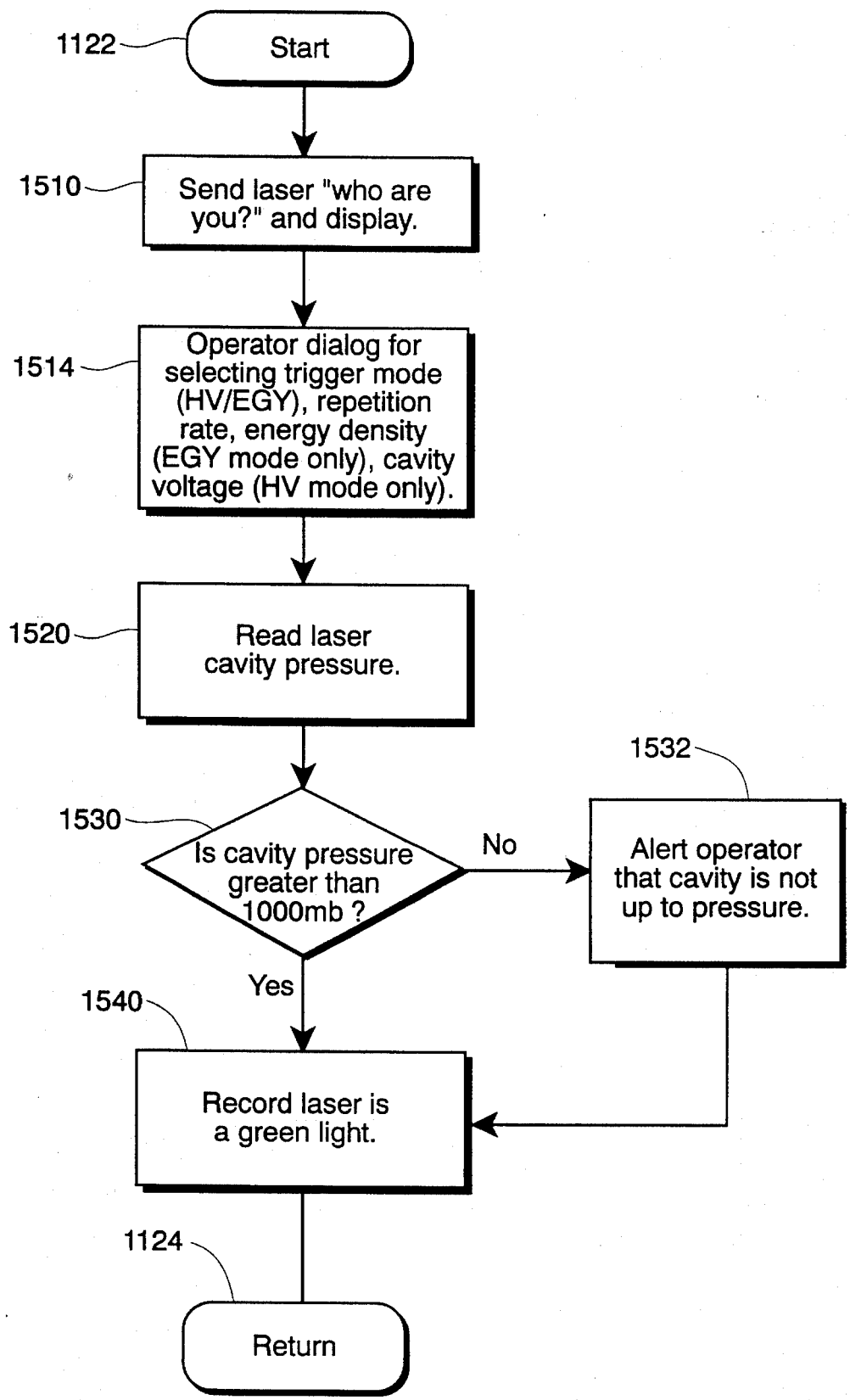

The operation of block 1500 in FIG. 11 to initialize the laser parameters is shown in FIG. 15, starting from the connector 1122. At block 1210, the program sends a laser "who are you?" message and display. Then at block 1514, the operation is to provide an operator dialog for selecting trigger mode (HV/EGY), repetition rate, energy density (EGY mode only), and cavity voltage (HV mode only). At block 1520, the program causes the laser cavity pressure to be read. The next block 1530 is for a decision if cavity pressure is greater than 100 mb. If no, the flow is to block 1532 to alert the operator that the laser cavity is not up to pressure. From block 1532, or from a "yes" decision at block 1530, operation goes to block 1540 to record that the laser is a green light. The flow then returns via connector 1124 to FIG. 11.

Figure 16:
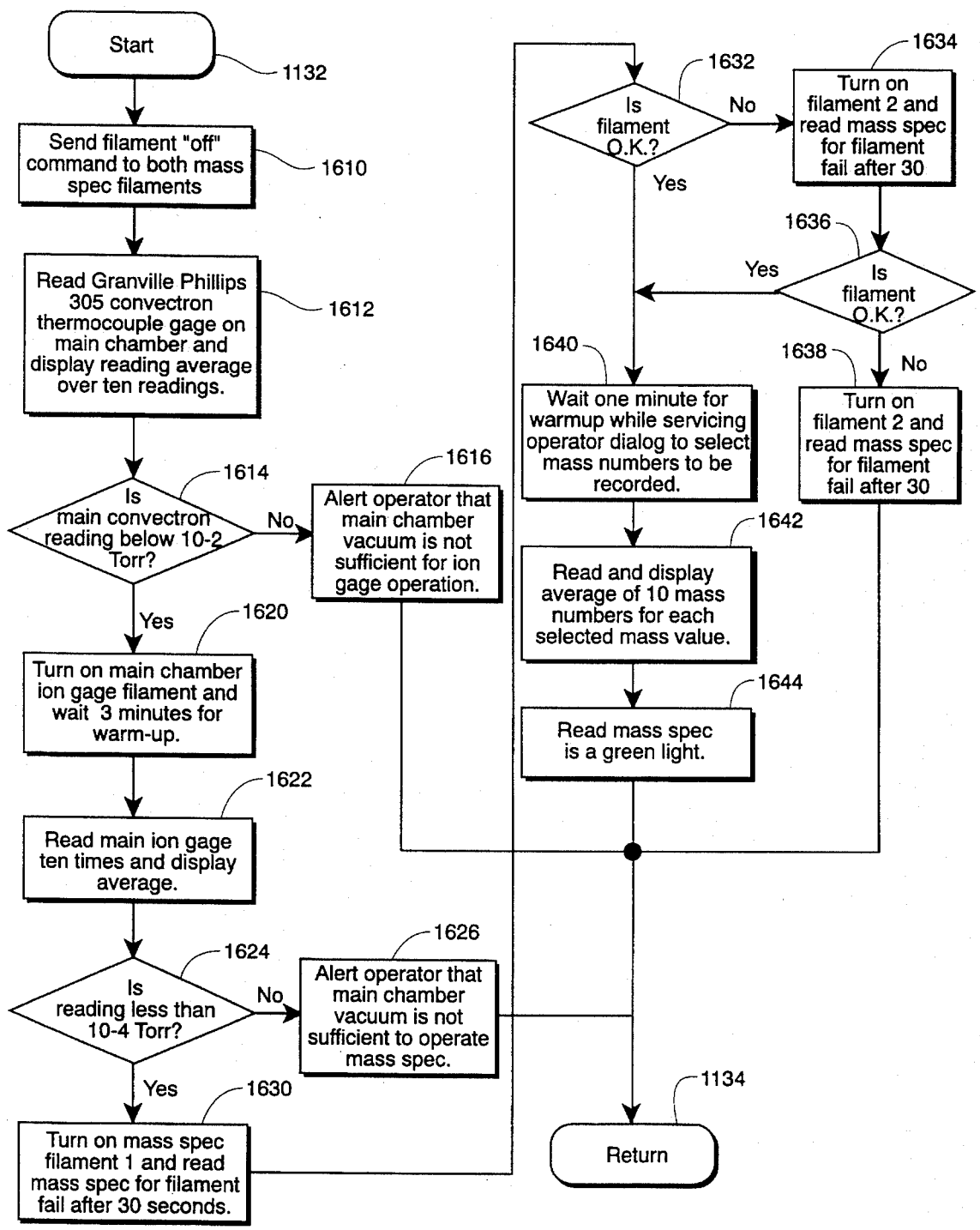

The operation of block 1600 in FIG. 11 to initialize the Dataquad mass spectrometer parameters is shown in FIG. 16, starting from connector 1132. At block 1610 the program causes the system to send a filament "off" command to both mass spectrometer filaments. At the next block 1612, the operation is to read the Granville Phillips 305 convectron thermocouple gage on the main chamber and display a reading average over ten readings. The next block 1614 if for a decision to determine if the main convectron reading is below $10^{-2}$ Torr. If "no" then at block 1616, a message is provided to alert the operator that the main chamber vacuum is not sufficient for ion gage operation, and then return via connector 1134. If the decision at block 1614 is "yes", then at block 1620 a command is generated to turn on the main chamber ion gage filament and wait three minutes for warm up. At the next block 1622, the operation is to read the main ion gage ten times and display the average. The next block 1624 looks for a decision to determine if reading is below $10^{-4}$ Torr. If "no" then at block 1626, a message is provided to alert the operator that the main chamber vacuum is not sufficient to operate the mass spectrometer, and then return via connector 1134. If the decision at block 1624 is "yes", then at block 1630 a command is generated to turn on the mass spectrometer filament 1 and read mass spectrometer for filament failure after thirty seconds. The next block 1632 is for a decision to determine if the filament is O.K. If 'No", then at block 1634, the operation is to turn on the filament 2 and read the mass spectrometer for filament failure after thirty seconds, and again at block 1636 determine if the filament is O.K. If "no", then at block 1638, the operation is to alert the operator that the mass spectrometer filaments are both bad, and return via connector 1134. If the decision at block 1636 is "yes", then at block 1640 the program waits one minute for warm-up while servicing operator dialog to select mass numbers to be recorded. The next block 1642 is to read and display an average of ten mass numbers for each selected mass value At the next block 1644, the operation is to record that the mass spectrometer is a green light, and return via connector 1134 to FIG. 11.

Figure 17:
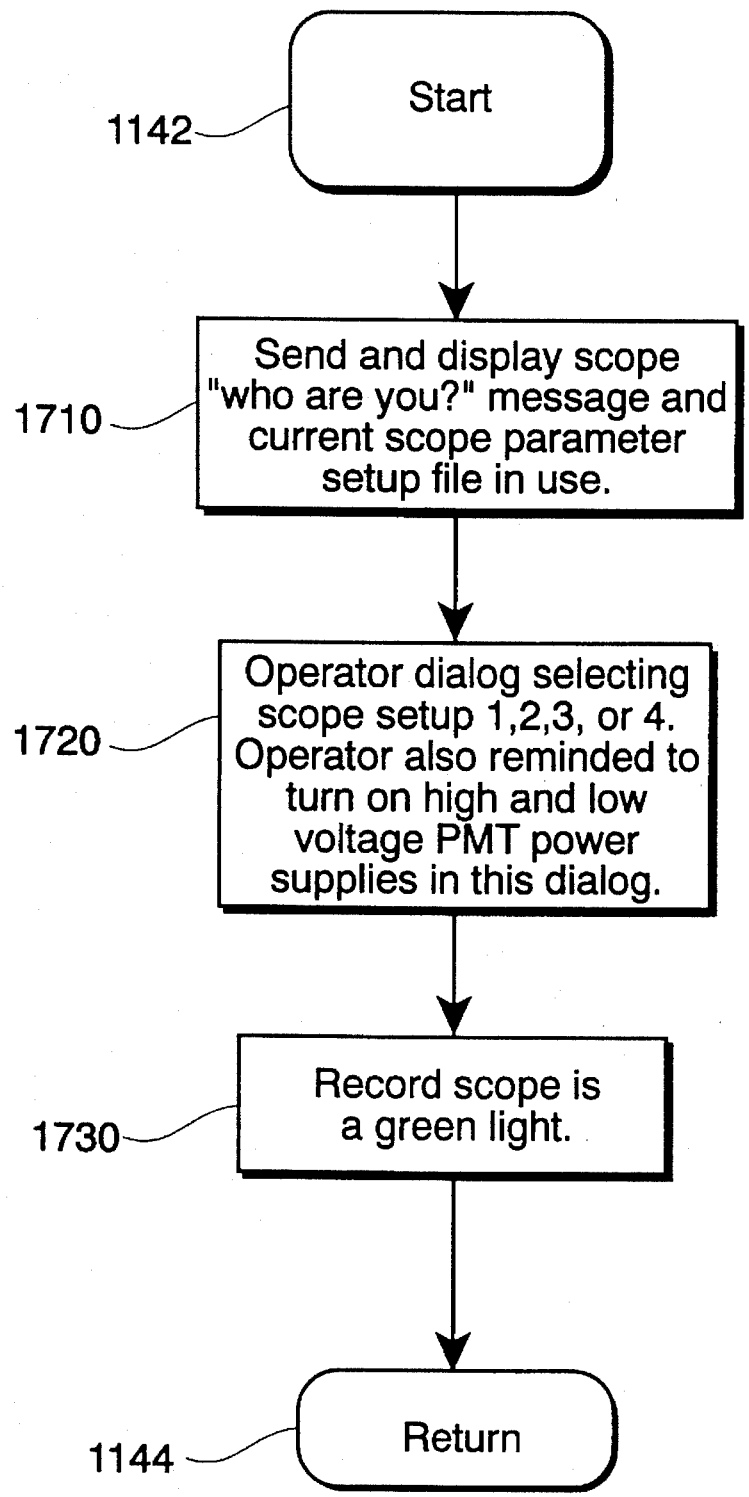

The operation of block 1700 in FIG. 11 to initialize the oscilloscope 530 parameters is shown in FIG. 17, starting from connector 1142. At block 1710 the program causes the system to send and display a scope "who are you?" message and current scope parameter setup file in use. The next block 1720 is for a operator dialog selecting scope setup 1, 2, 3, or 4. the operator is also reminded to turn on the high and low voltage PMT power supplies in this dialog. At the next block 1730, the operation is to record that the scope is a green light, and return via connector 1134 to FIG. 11.

Figure 18:
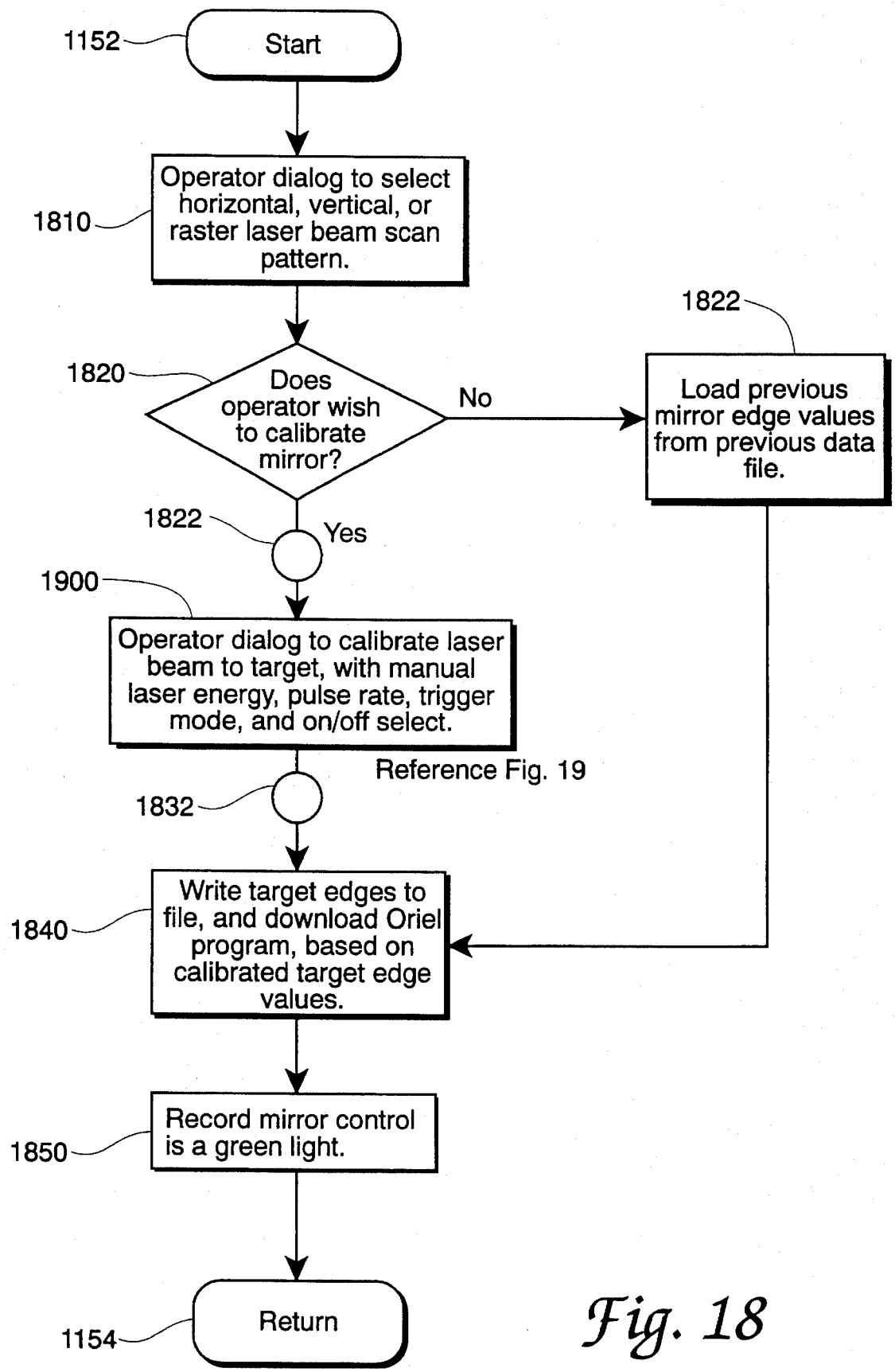

The operation of block 1800 in FIG. 11 to initialize, start operation, and save to data file, selected oscilloscope parameters is shown in FIG. 18, starting from connector 1152. The block 1820 is for a operator dialog to select horizontal, vertical, or raster laser beam scan pattern. Next is a decision block 1820 to determine if the operator wishes to calibrate the mirror 427. If "no", then at block 1822, the operation is to load previous mirror edge values from a previous data file, and go to block 1840. If the decision from block 1820 is "yes", then the program goes via connector 1822 to a routine 1900 (FIG. 19) for an operator dialog to calibrate the laser beam to target, with manual laser energy, pulse rate, trigger modec and on/off select. The routine 1900 returns via connector 1832 to block 1840, to write target edges to file, and download Oriel program, based on calibrated target edge values. At the next block 1850, the operation is to record that the mirror control is a green light, and return via connector 1154 to FIG. 11.

Figure 19:
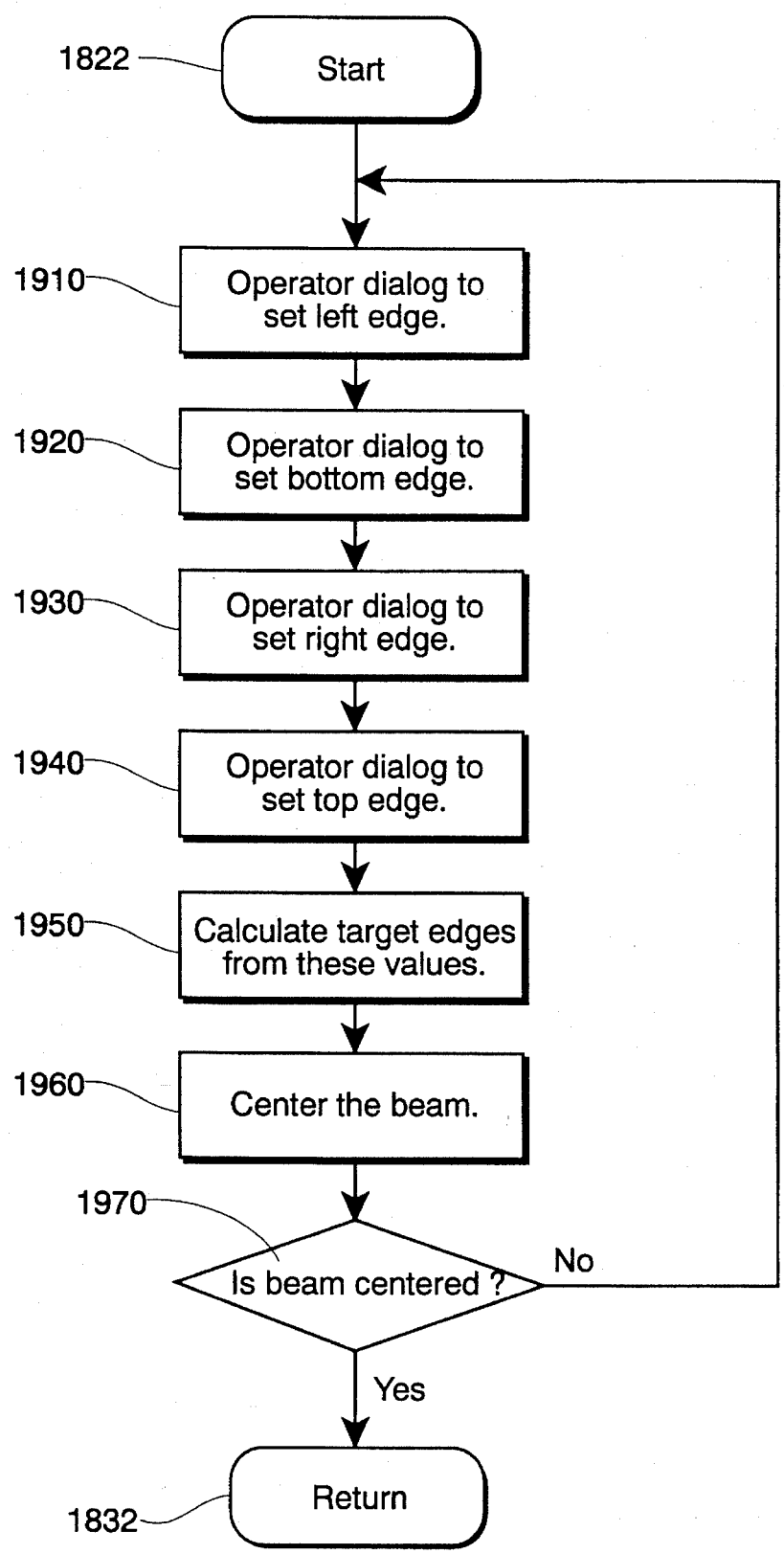

The routine for block 1900 is shown in FIG. 19, starting from the connector 1822. At blocks 1910, 1920, 1930 and 1940, the operator dialog is set to the left, bottom, right and top edges, respectively. Then at block 1950, the program calculates the target edges from these values. At the next block 1970, the beam 423 is centered. The next block 1970 is for a decision to determine if the beam is centered. If "no", operation goes back to block 1910 to reset the edges. If the decision is "yes" the operation returns via connector 1832 to FIG. 18.

Figure 20:
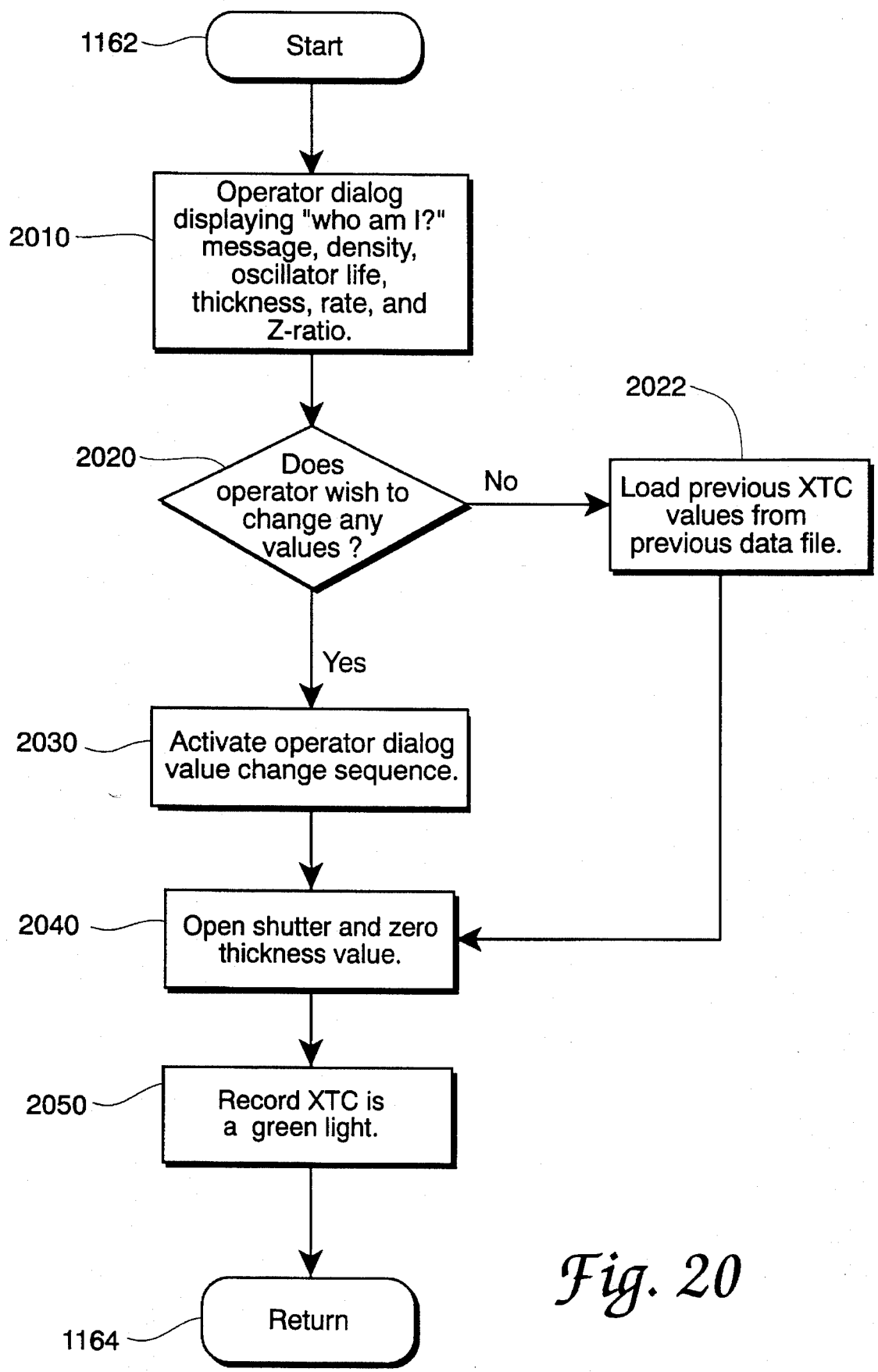

The operation of block 2000 in FIG. 11 to initialize and save the XTC/2 quartz crystal microbalance parameters is shown in FIG. 20, starting from connector 1162. Block 2010 is for an operator dialog, displaying a "who am I?" message, density, oscillator life, thickness, rate, and Z-ratio. Next there is a division block 2020 to determine if the operator wishes to change any values. If "no", operation goes to block 2022 to load previous XTC values from a previous file, and go to block 2040. If "yes", operation goes to block 2030, to activate an operator dialog value change sequence. The next block 2040 is to open shutter and zero thickness value. At the next block 2050, the operation is to record that XTC is a green light, and return via connector 1164 to FIG. 11.

Figure 9:
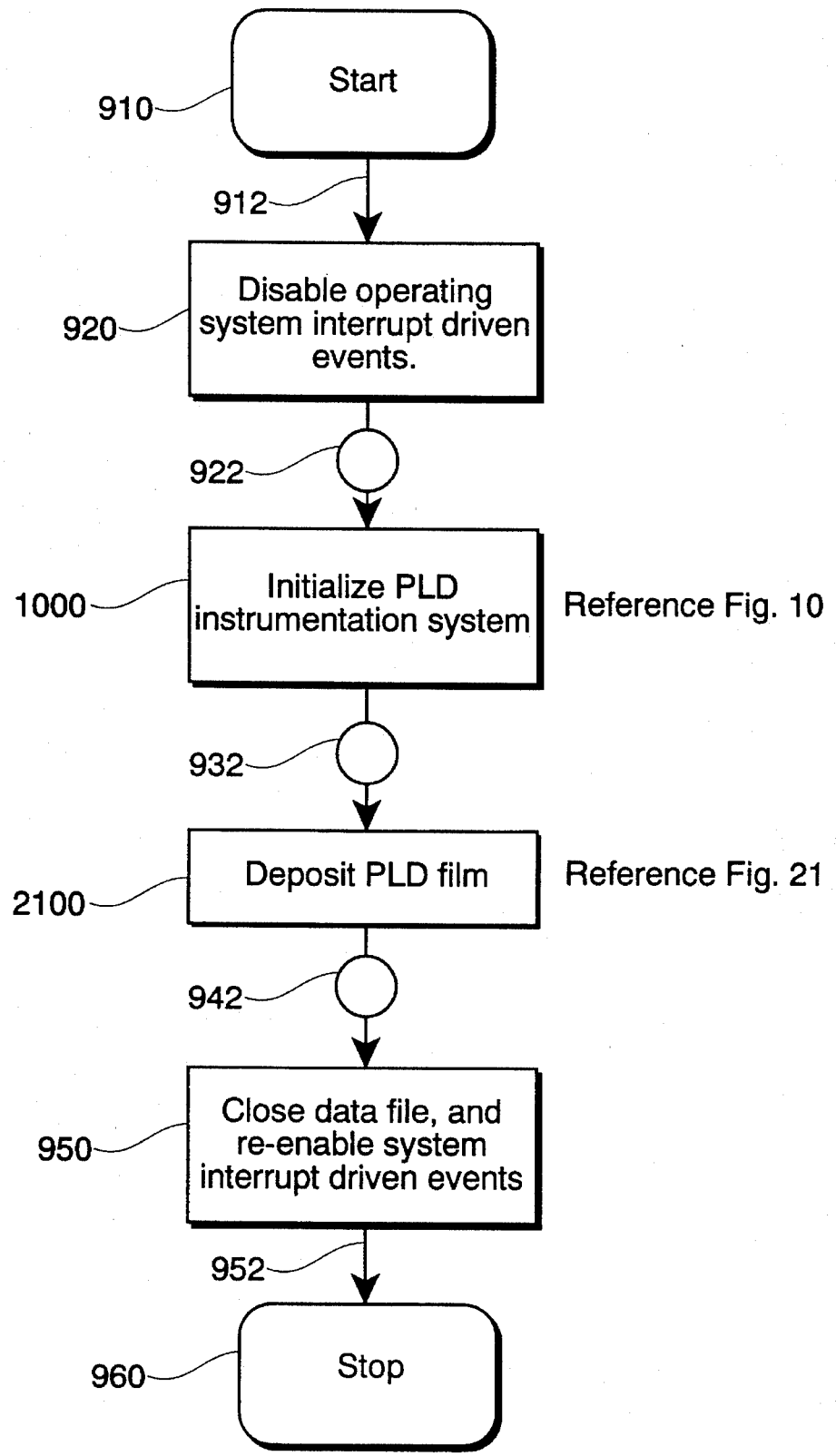
FIGS. 9–28 are flow charts of a pulsed laser deposition sequence.

The deposit PLD film routine 2100 of FIG. 9 is shown in FIG. 21, starting from the connector 932. The block 2111 is to zero the timer. The next block 2120 is to read operator console emergency stop, and block 2130 is for a decision as to whether emergency stop has been selected. If "yes", then at block 2132 the program will cause shutdown of the laser, alert the operator, and write "Emergency Stop" to the data file. In the decision at block 2130 is "no", the next operation at block 2140 is to read the operator console for data stop command. Block 2150 is for a decision as to whether data collection stop has been selected. If "yes" operation goes to the return 942. If "no", operation goes via a connector 2152 to a read selected instrument data routine 2200 (FIG. 22), which returns via connector 2172. Next there is a routine 2800 (FIG. 28) to check front panel controls, with a return via connector 2174. The next block 2180 is to read operator console sample time. A decision block 2190 determines if loop timer is greater than sample time. If "yes" operation goes to block 2192 to wait until sample time has expired. When the decision from block 2190 is "no", operation returns to block 2110. Operation continues to loop until the decision from block 2150 (or block 2150) is "yes" to return via connector 942 to FIG. 9.

Figure 22:
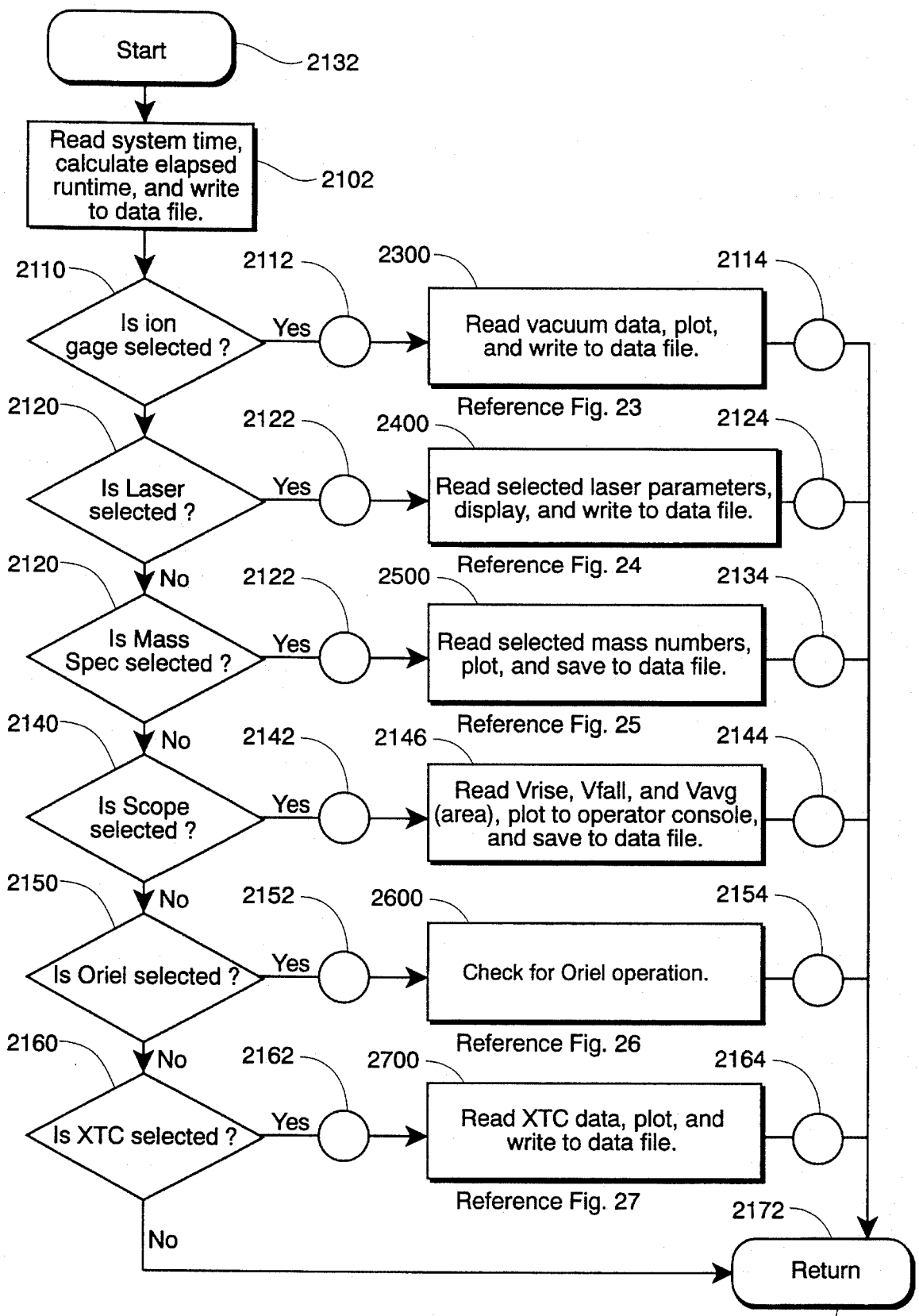

In FIG. 22, which starts at connector 2152, after a block 2102 to read system time, calculate elapsed runtime, and write data file; there is a case statement, or series of "if-then" decisions. If the ion gage (vacuum gage 428 in FIG. 1) is selected, then from block 2110 via connector 2112, the operation goes to a routine 2300 (FIG. 23) to read vacuum data, plot, and write to data file. If the laser (422 in FIG. 1) is selected, then from block 2120 via connector 2122, the operation goes to a routine 2400 (FIG. 24) to read selected laser parameters, and write to data file. If the mass spectrometer (432 in FIG. 1) is selected, then from block 2130 via connector 2132, the operation goes to a routine 2500 (FIG. 25) to selected mass numbers, and write to data file. If the scope (530 in FIG. 5) is selected, then from block 2140 via connector 2142 the operation goes to a routine 2146 to read Vrise, Vfall, and Vavg (area), plot to operator console and save to data file. If the Oriel is selected, then from block 2150 via connector 2152, the operation goes to a routine 2600 (FIG. 26) to check for Oriel operation. If the XYC is selected, then from block 2160 via connector 2162, the operation goes to a routine 2700 (FIG. 27) to XTC data, plot, and write to data file. At the completion of the operation in any of the routines in FIG. 22, or if the decisions from blocks 2110 to 2160 are all no, operation returns via connector 2172 to FIG. 21.

Figure 23:
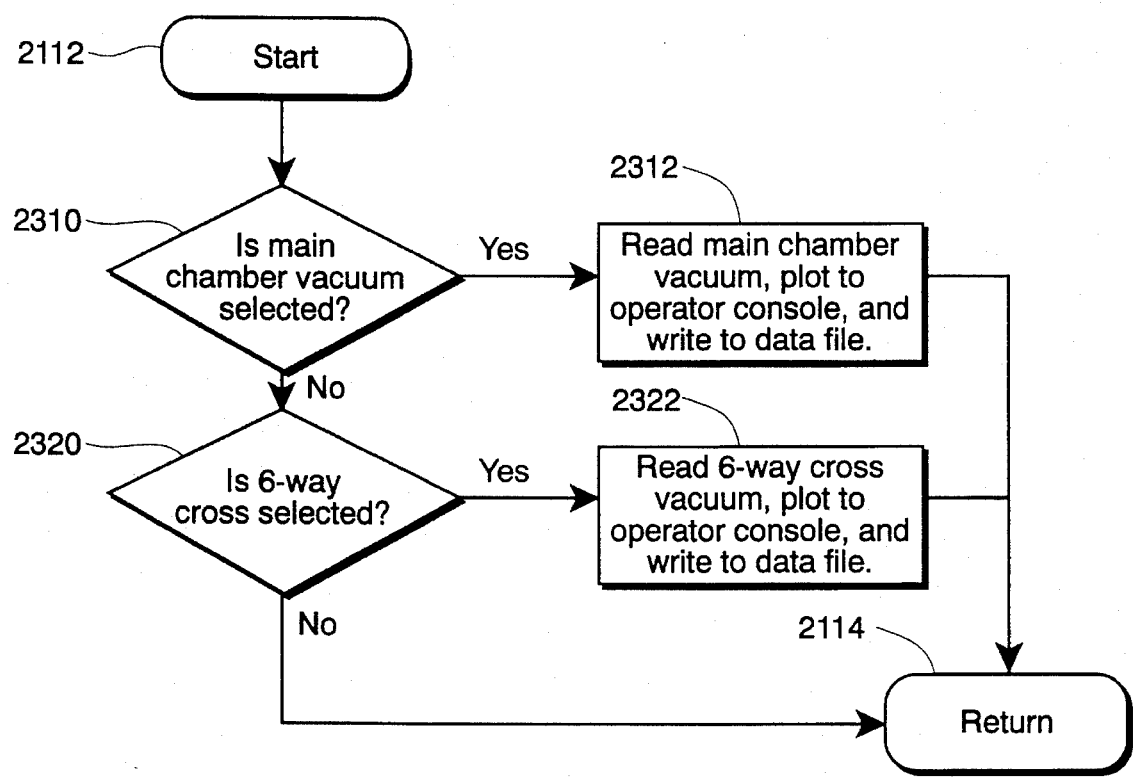

The operation of block 2300 in FIG. 22 to read vacuum data, plot, and write to data file is shown in FIG. 23, starting from the connector 2112. If the main chamber vacuum is selected, then operation goes via the decision block 2310 to block 2312 to read the main chamber vacuum, plot to operator console, and write to data file, and return to FIG. 22 via connector 2114. If the 6-way cross is selected, then operation goes via the decision block 2320 to block 2322 to read the 6-way cross vacuum, plot to operator console, and write to data file, and return to FIG. 22 via connector 2114.

Figure 24:
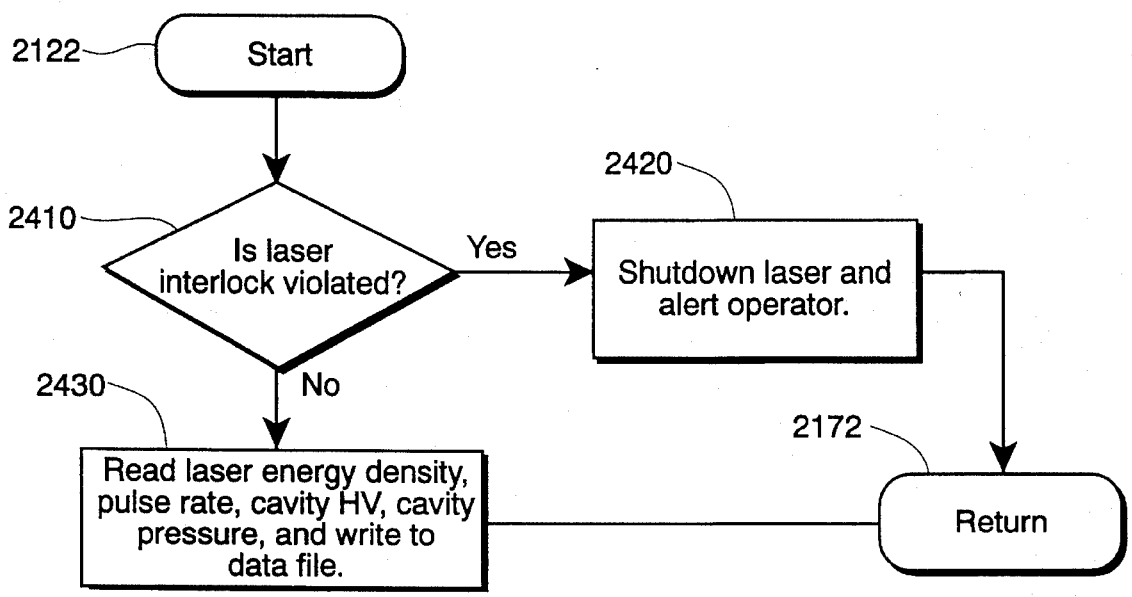

The operation of block 2400 in FIG. 22 to read selected laser parameters, display, and write to data file is shown in FIG. 24, starting from the connector 2122. Decision block 2410 determines whether the laser interlock is violated. If "yes" operation goes to block 2420 to shutdown the laser and alert the operator. If the decision from block 2410 is "no" operation goes to block 2430 to read the laser energy density, pulse rate, cavity high voltage, cavity pressure, and write to data file. From either block 2420 or block 2430, operation returns to FIG. 22 via connector 2172.

Figure 25:
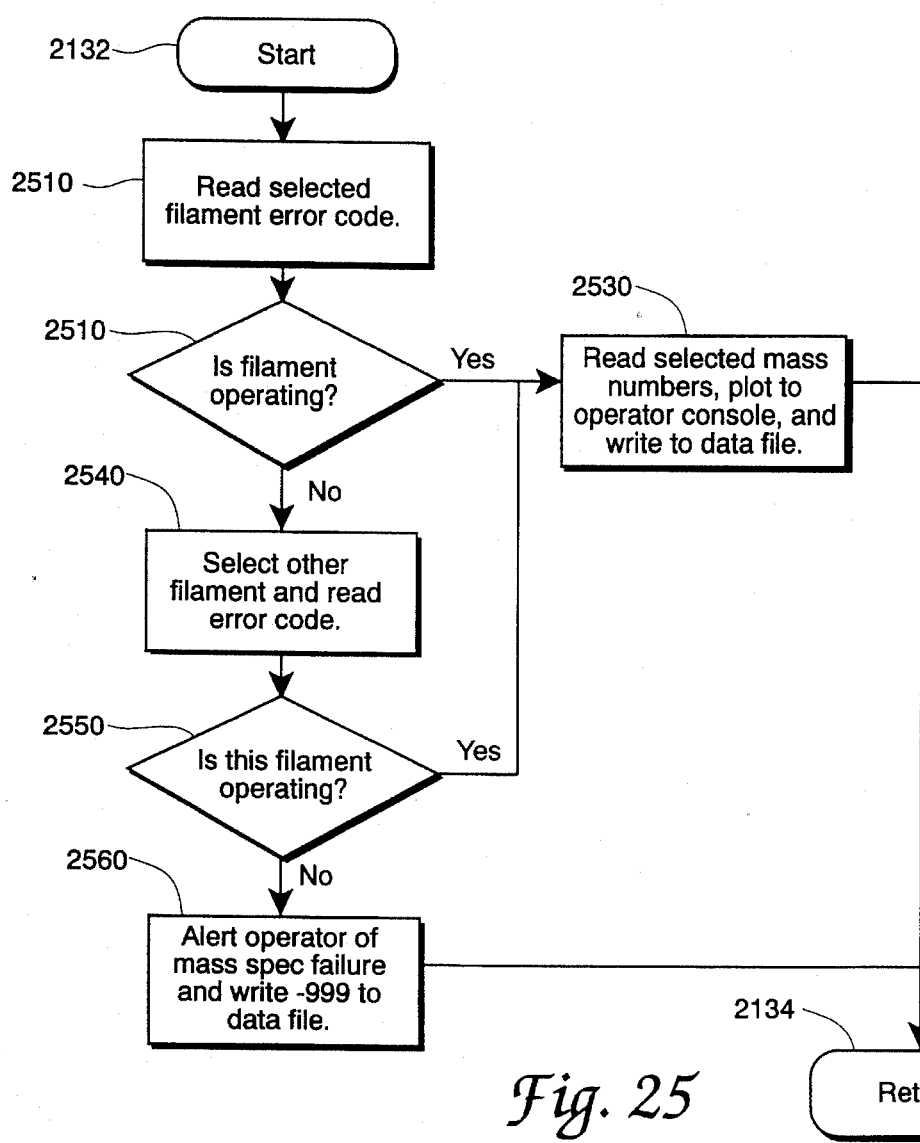

The operation of block 2500 in FIG. 22 to read selected mass numbers, display, and write to data file is shown in FIG. 25, starting from the connector 2132. Block 2510 is to read selected filament error code. A decision block 2520 determines whether the selected filament is operating. If not, block 2540 selects the other filament and reads the error code; and decision block 2550 determines if this filament is operating. If the decision from either block 2520 or block 2550 is "yes", operation goes to block 2530 to read selected mass numbers, plot to operator console, and write to data file. If neither filament is operating, operation goes to block 2560 to alert the operator of a mass spectrometer failure and write −999 to data file. From either block 2530 or block 2560, operation returns to FIG. 22 via connector 2134.

Figure 26:
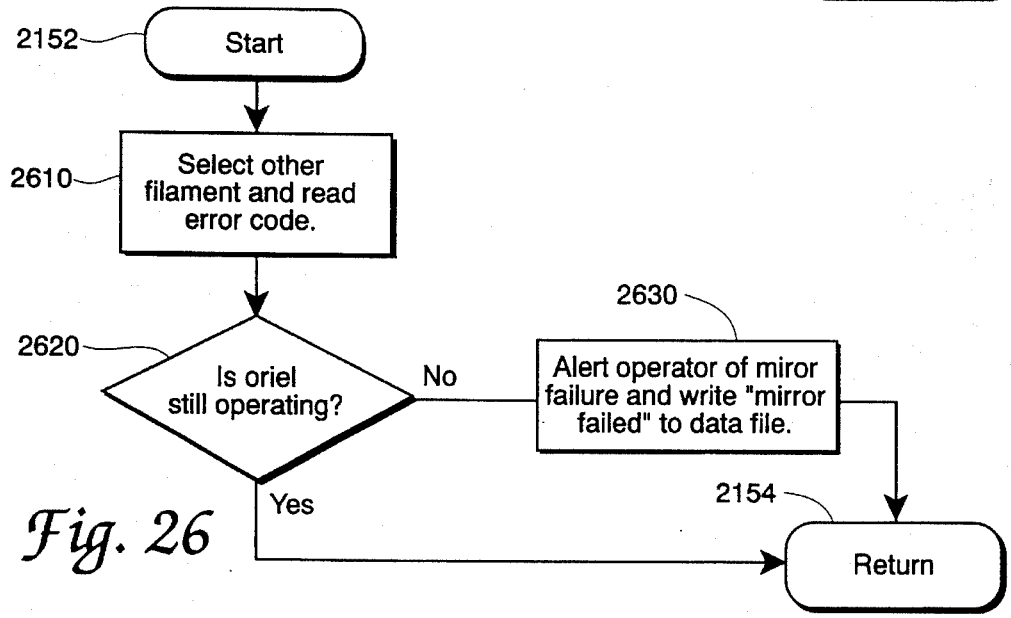

The operation of block 2600 in FIG. 22 to check for Oriel operation is shown in FIG. 26, starting from the connector 2152. Block 2610 is to read the Oriel operation code. A decision block 2620 determines whether the Oriel is still operating. If not, operation goes to block 2630 to alert the operator of mirror failure and write "mirror failed" to the data file. From block 2630, or from a "yes" from block 2620, operation returns to FIG. 22 via connector 2154.

Figure 27:
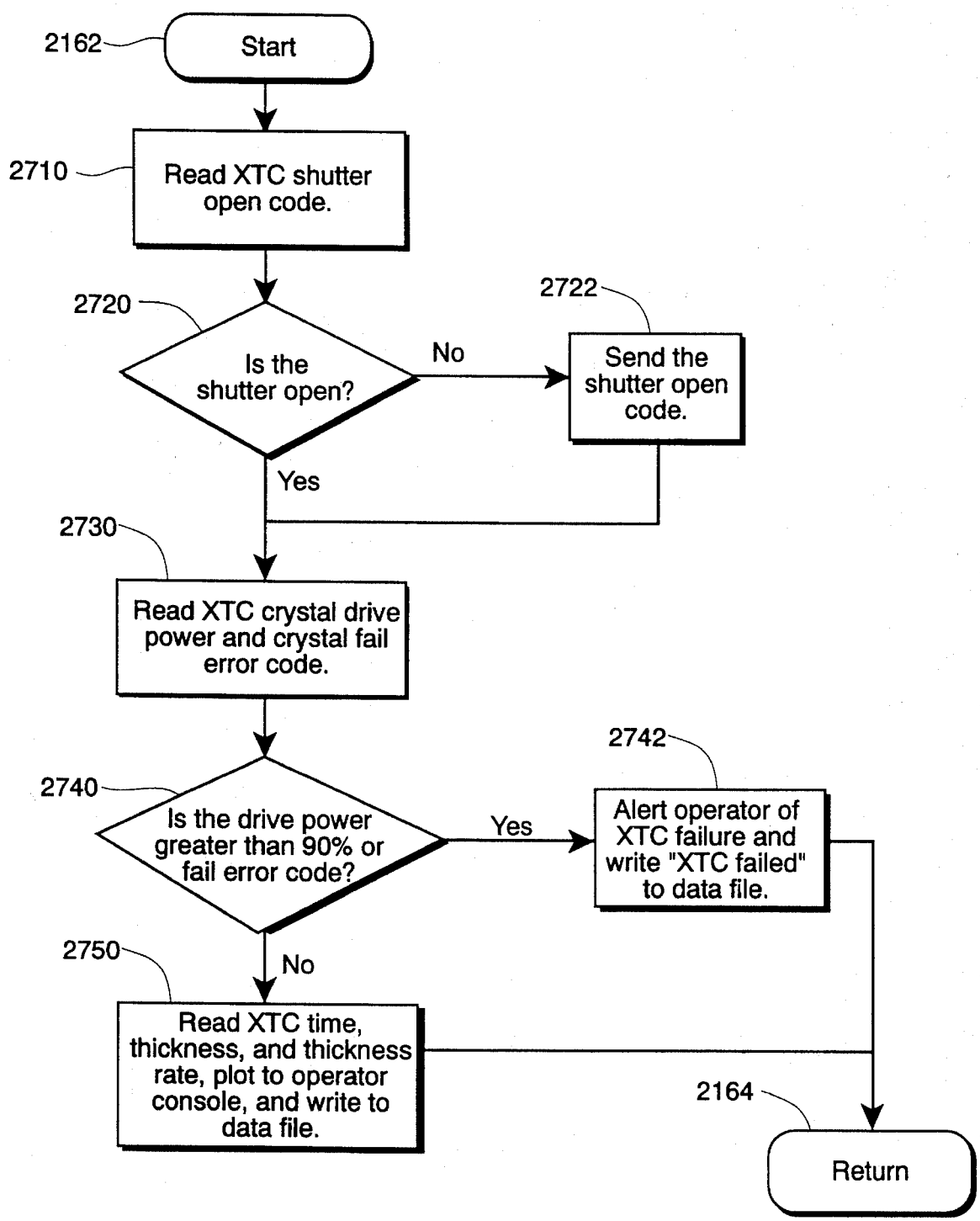

The operation of block 2700 in FIG. 22 to read XTC data, plot, and write to data file is shown in FIG. 27, starting from the connector 2162. Block 2710 is to read the XTC shutter open code. A decision block 2720 determines whether the shutter is open. If not, operation goes to block 2722 to send the shutter open code. From block 2722, or a "yes" from block 2720, operation goes to block 2730 to read the XTC crystal drive power and crystal fail error code. A decision block 2740 is used to determine if the drive power is greater than 90% or if there is a fail error code. If "yes" operation goes to block 2742 to alert the operator of XTC failure and write "XTC failed" to the data file. If the decision from block 2740 is "no", operation goes to block 2750- to read the XTC time, thickness, and thickness rate, plot to operator console, and write to data file. From either block 2742 or block 2750, operation returns to FIG. 22 via connector 2164.

Figure 28:
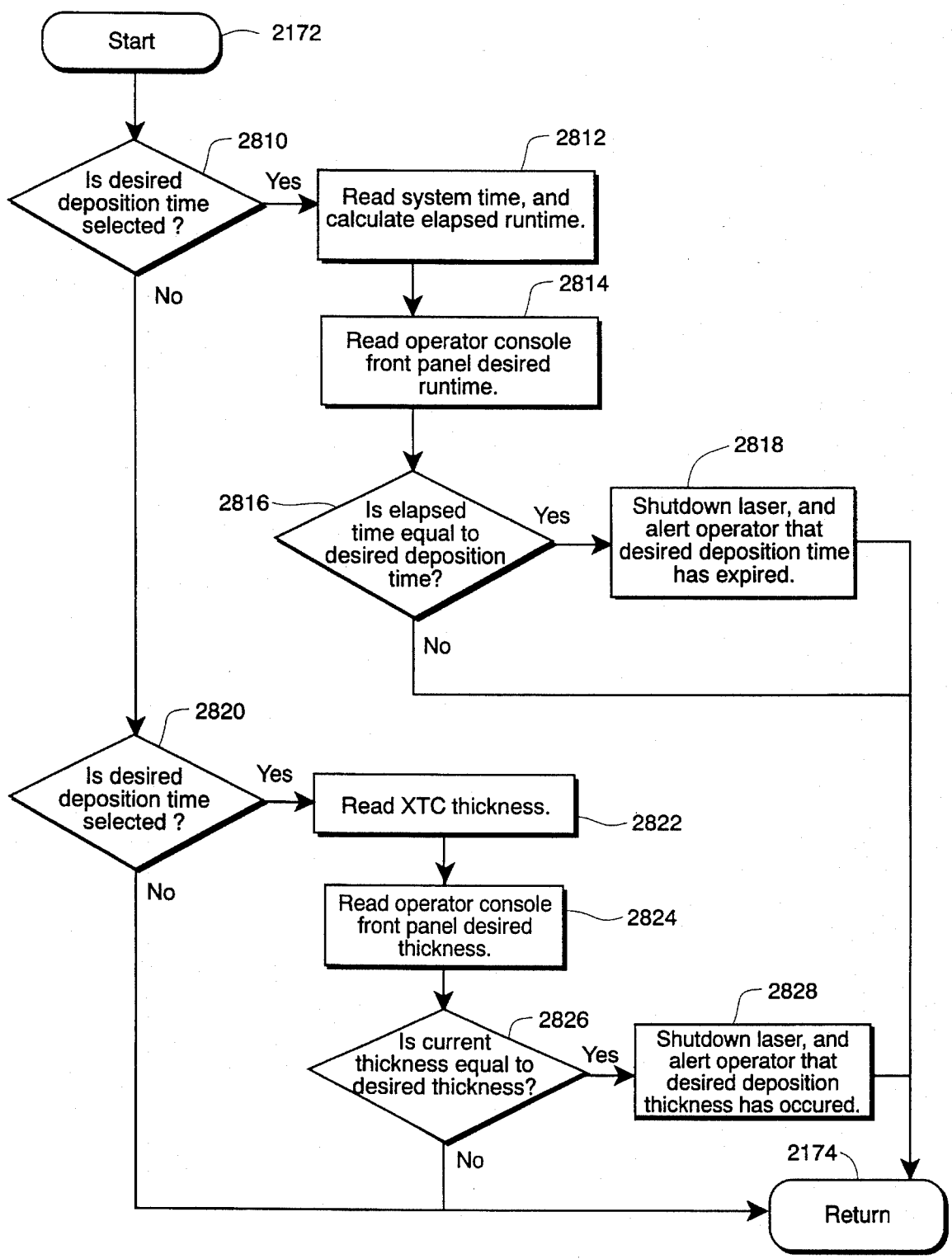

The operation of block 2800 in FIG. 21 to check front panel controls is shown in FIG. 28, starting from the connector 2172. The two decision blocks may select either a desired deposition time at block 2810, or a desired deposition thickness at block 2820. If deposition time is selected, operation goes from block 2810 to block 2812 to read the system time, calculate elapsed run time. The next block 2814 is to read the operator console front panel desired runtime. The decision block 2816 determines if the elapsed time is equal to the desired deposition time. If "yes" operation goes to block 2818 to shutdown the laser, and alert the operator that the desired deposition time has expired. If deposition thickness is selected, operation goes from block 2820 to block 2822 to read the XTC thickness. The next block 2824 is to read the operator console front panel desired thickness. The decision block 2826 determines if the elapsed thickness is equal to the desired deposition thickness. If "yes" operation goes to block 2828 to shutdown the laser, and alert the operator that the desired deposition thickness has expired. From block 2818 of block 2828, return is via connector 2174 to FIG. 21. If neither time or thickness is selected, the "no" from blocks 2810 and 2820 also causes a return via connector 2174.

Uses—An automation system to be used for superconductor research in The Air Force Wright Laboratory, Materials Directorate, is currently being implemented. The invention has been used experimentally since the initial implementation for tribological research. Other possible uses include Molecular Beam Epitaxy (MBE) and Chemical Vapor Deposition (CVD) automation.

Advantages and New Features—Automation advantages enable the operator of a PLD system to rely on existing setup and operation scenarios, thus requiring less expertise in apparatus operation and skill. The integration of computer controlled instrumentation and setup also allows for deposition process monitoring in real time, thus permitting a new method of characterizing PLD process parameters for a given deposition.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

APPENDIX

Automation of PLD FIG 9
** subroutines

Start
disable operating system interrupt driven events
 Initialize PLD instrumentation system FIG 10**
    Select instruments to be used during deposition
    Initialize data file name, type and location
    Store parameters
    Enter substrate type
        temperature
        background gas
        target type
        comments
     Initialize IEEE 488 instruments FIG 11**
        if ion gauge selected then
             initialize and save to data file vacuum gauge parameter FIG 12**
                send filament "off" command
            do 1 to 10
                read convectron gauge on 6 way cross
                read convectron gauge on chamber
            end do
            computer average for 6 way cross = cg6wc
            computer average for chamber = cgc
            if ((cgc-cg6wc)/cgc>.05 AND cgc>10^-2 Torr) then
                alert operator that inter-chamber door is not to be opened
            endif
         read convectron gauge on 6 way cross FIG 13**
            if 6 way cross selected then
                read thermocouple gauge on 6 way cross
                display reading average over 10 reading
                if cg6wc<10^-2 Torr
                    turn on 6 way cross filament
                    wait 3 minutes for warm up
                    read 6 way cross ion gauge 10 times
                    display average
                    record 6 way cross is a vacuum green light
                else
                    alert operator that 6 way cross vacuum is not
                        adequate for ion gauge
                endif
            endif
RETURN
 read convectron gauge on chamber FIG 14**
        if main chamber selected then
            read thermocouple gauge on main chamber
            display reading average over 10 reading
            if cgc<10^-2 Torr
                turn on main chamber filament
                wait 3 minutes for warm up
                read main chamber ion gauge 10 times
                display average
                record main chamber is a vacuum green light

```
                        else
                                alert operator that main chamber vacuum is
                                        not adequate for ion gauge
                        endif
                endif
                RETURN
                record values
        RETURN
endif
if laser selected then
        ** initialize and save to data file laser parameters FIG 15
                send laser "who are you"
                display
                dialog box for selection of parameters
                        trigger mode (either EGY or HV)
                        repetition rate
                        energy density (EGY mode only)
                        cavity voltage (HV mode only)
                read laser cavity pressure
                if cavity pressure > 1000mb then
                        record laser is a green light
                else
                        alert operator that laser cavity is not up to pressure
                endif
        RETURN
endif
if mass spec selected then
        ** Initialize and save to data file mass spec parameters FIG 16
                send off command to both mass spec filaments
                read thermocouple gauge on main chamber
                display reading average over 10 readings
                if convectron reading < 10^-2 Torr then
                        turn on main chamber ion gauge filament
                        wait 3 minutes for warm up
                        read main ion gauge 10 times and display average
                        if average < 10^-4 Torr then
                                turn on mass spec filament 1
                                read mass spec filament
                                if filament 1 fail then
                                        turn on mass spec filament 2
                                        read mass spec filament
                                        if filament 2 fail then
                                                alert operator that mass spec filaments
                                                        are both bad
                                        endif
                                else
                                        wait for one minute for warm-up
                                        select mass numbers to be recorded via dialog
                                                box
                                        record mas spec is a green light
                                endif
                        else
                                alert operator that main chamber is not sufficient to
                                        operate mass spec
```

```
                                endif
                        else
                                alert operator that main chamber vacuum is not sufficient for
                                        ion gauge operation
                        endif
                RETURN
        endif
        if scope selected then
                ** initialize and save oscilloscope parameters FIG 17
                        send "who are you" to scope
                        display current scope parameters setup file in use
                        dialog box select
                                scope setup file parameter selection 1, 2, 3, or 4
                                reminder to turn on high and low voltage PMT power
                                        supplies
                        record scope is green light
                RETURN
        endif
        if Oriel selected then
                ** initialize and save Oriel mirror controller parameters FIG 18
                        dialog box to select
                                horizontal, vertical or raster laser beam scan pattern
                        if operator wants to calibrate mirror then
                                ** dialog box to calibrate laser beam to target FIG 19
                                        set center of target with dialog box, use HeNe as
                                                calibration beam
                                        set scale with dialog box
                                        down load scan program to Newport controller and
                                                execute once
                                        if scan pattern does not have adequate coverage then
                                                goto set center of target with dialog box
                                        endif
                                RETURN
                        else
                                load previous mirror edge values from previous settings file
                        endif
                        write target edges to file
                        download Oriel program based on calibrated target edge values
                        record mirror control is green light
                RETURN
        endif
        if XTC selected then
                ** initialize and save XTC parameters FIG 20
                        send "who are you" message to XTC
                        get current parameters
                        display current parameters
                        dialog box display/change parameters
                                density
                                oscillator life
                                thickness
                                rate
                                z-ratio
                        if operator want to change parameters then
                                activate operator dialog value change sequence
```

```
                else
                        load previous XTC values form previous data file
                endif
                open shutter
                zero thickness value
                record XTC is green light
            RETURN
        endif
RETURN
Read initialization values
Check for green lights on selected instruments
If (all systems go) then
        Turn on laser
else
        choose to abort, retry or ignore instrument without green light
        if retry
                select only instrument without green light
                goto * initialize IEEE 488 instruments
        if abort
                alert operator deposition has been terminated
                revert to previous data file
                stop
        if ignore
end if
        turn on laser
RETURN
** Deposit PLD film FIG 21
        do until data collection stop selected
        Set timer to zero
        read operator console emergency stop
        if emergency stop is not selected then
                read operator console for data collection stop
                if data collection stop not selected then
                        ** read selected instrument data FIG 22
                                read system time
                                calculate elapsed runtime
                                write to data file
                                if ion gauge selected then
                                        ** read vacuum data, plot and write to data file FIG 23
                                                if main chamber selected then
                                                        read main chamber vacuum
                                                        plot to operator console
                                                        write to data file
                                                endif
                                                if 6-way cross selected then
                                                        read 6 way cross vacuum
                                                        plot to operator console
                                                        write to data file
                                                endif
                                        RETURN
                                endif
                                if laser selected then
                                        ** read selected laser parameters, display and write FIG 24
                                        if laser interlock violated then
```

```
                    shutdown laser
                    alert operator
            else
                    read laser energy density, pulse rate, cavity HV,
                            cavity pressure
                    write to data file
            endif
            RETURN
    endif
    if mass spec selected then
            ** read selected mass numbers, plot, and save to data file
            FIG 25
                    read selected filament error code
                    if filament code non-operational then
                            select other filament
                            read error code
                            if other filament code non-operational then
                                    alert operator of mass spec failure
                                    write 999 to data file
                            else
                                    read selected mass numbers
                                    plot to operator console
                                    write to data file
                            endif
                    else
                            read selected mass numbers
                            plot to operator console
                            write to data file
                    endif
            RETURN
    endif
    if scope selected then
            read vrise, vfall, and vavg(area)
            plot to operator console
            save to data file
    endif
    if Oriel selected then
            ** Check for Oriel operation FIG 26
                    read Oriel operation code
                    if Oriel not operating then
                            alert operator of mirror failure
                            write "mirror failed" to data file
                    endif
            RETURN
    endif
    if XTC selected then
            ** read XTC data, plot, and write to data file FIG 27
                    read XTC shutter open code
                    if shutter closed then
                            send shutter open code
                    endif
                    read XTC crystal drive power, crystal fail error code
                    if ((drive power > 90%) OR (error code = fail)) then
                            alert operator of XTC failure
```

```
                                        write "XTC failed" to data file
                        else
                                        read XTC time, thickness, thickness rate
                                        plot to operator console
                                        write to data file
                        endif
                RETURN
        endif
RETURN
** check front panel controls FIG 28
        if desired deposition time selected then
                read system time
                calculate elapsed runtime
                read operator entered desire runtime
                if elapsed time = desired deposition runtime then
                        shutdown laser
                        alert operator "desired deposition time has expired"
                endif
        else
                if desired deposition thickness selected then
                        read XTC thickness
                        read operator entered desired thickness
                        if current thickness = desired thickness then
                                shutdown laser
                                alert operator the desired deposition thickness
                                        has occurred
                        endif
                endif
        endif
        RETURN
        read operator console sample time
        if loop timer greater than sample time then
                wait until sample time has expired
        endif
                endif
        else
                shutdown laser
                alert operator
                write "emergency stop" to data file
        endif
RETURN
RETURN
close data file
re-enable system interrupt driven events
stop
```

What is claimed is:

1. A computer control system for a Pulsed Laser Deposition (PLD) growth process in which a target of a given material and a substrate are located within a vacuum chamber and subjected to laser beam scanning;

said PLD process having beam control means for controlling the direction of the laser beam to scan the target to produce a plasma which coats the substrate;

said PLD process including sensors for the vacuum chamber, with data acquisition means coupled to at least one of said sensors;

said PLD process also having a process control computer including an operator console, with said process control computer being coupled via a bus to bus instruments for said sensors and said data acquisition means;

wherein said computer control system comprises:

means for initializing a PLD instrumentation system which includes means for opening a data file means;

means for determining a presence of selected condition-indicating signals from said vacuum chamber sensors;

means for controlling deposit of a PLD film and for determining when a desired deposition is completed and then shutting down said laser; and means for closing said data file means.

2. A computer control system for a Pulsed Laser Deposition (PLD) thin-film tribological growth process under control by an operator using an operator console, in which a target of $MoS_2$ material and a substrate are located within a vacuum chamber, and a laser transmits a ultra violet laser beam via a mirror gimbal, mirror control means for controlling the mirror gimbal to give a raster on the target to produce a plasma which coats the substrate, wherein there are sensors for the vacuum chamber including a vacuum gage, a thickness monitor having a quartz crystal micro balance, a mass spectrometer, and a spectroscopy sensor, with data acquisition means coupled to the spectroscopy sensor;

a process control computer including said operator console, the process control computer being coupled via a bus to bus instruments comprising the laser, the mirror control means, the data acquisition means, the vacuum gage, the thickness monitor, and the mass spectrometer;

wherein said computer control system comprises:

means for disabling system interrupt driven events, means for initializing a PLD instrumentation system which includes means for opening a data file means, means for controlling deposit of a PLD film, means for closing the data file means and for means for re-enabling the system interrupt driven events;

wherein said means for initializing a PLD instrumentation system comprises means for dialogs with the operator to select a set of said instruments to be used during deposition, as well as a data file name, type and location, to store all parameters, to enter and save substrate type, temperature, background gas, target type, and other comments; means for initializing said bus instruments; means for reading inialization values and for verifying that all instruments of said set are operable;

wherein said means for initializing said bus instruments comprises means for initializing includes turning on, and saving to the data file selected parameters, for instruments of said set;

wherein said means for controlling deposit of a PLD film comprises means for zeroing a loop timer, means for reading the operator console for a data stop command, which if selected ends the means for controlling deposit of a PLD film, means operative if the data stop command is not selected to go to means to read selected instrument data, followed by means to check front panel controls, means to read operator console sample time, and means to check the loop timer and wait until a sample time has expired and then return to the means for zeroing the loop timer;

wherein the means to read selected instrument data comprises means for reading selected data for selected instruments and for writing the selected data to the data file;

wherein the means to check front panel controls comprises means operative if a desired deposition time has been selected for reading system time and calculating elapsed runtime, means for reading operator console desired runtime, and means operative if the elapsed time is equal to the desired deposition time for shutting down the laser and alerting the operator that the desired deposition time has expired, otherwise returning; and means operative if a desired deposition thickness has been selected for reading thickness, means for reading operator console desired thickness, and means operative if the current thickness is equal to the desired thickness for shutting down the laser and alerting the operator that the desired deposition thickness has occurred, otherwise returning.

\* \* \* \* \*